United States Patent
Shimoyama et al.

(10) Patent No.: US 10,908,713 B2
(45) Date of Patent: Feb. 2, 2021

(54) MANUFACTURING METHOD OF TOUCH PANEL

(71) Applicant: FUJIFILM Corporation, Tokyo (JP)

(72) Inventors: Tatsuya Shimoyama, Shizuoka (JP); Hideyuki Nakamura, Shizuoka (JP); Kentaro Toyooka, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/366,497

(22) Filed: Mar. 27, 2019

(65) Prior Publication Data

US 2019/0265812 A1    Aug. 29, 2019

Related U.S. Application Data

(63) Continuation of application No. PCT/JP2017/032370, filed on Sep. 7, 2017.

(30) Foreign Application Priority Data

Sep. 29, 2016 (JP) ................. 2016-192277

(51) Int. Cl.
*H01L 21/00* (2006.01)
*G06F 3/041* (2006.01)
*C08F 2/44* (2006.01)
*G02F 1/1333* (2006.01)
*G03F 7/004* (2006.01)
(Continued)

(52) U.S. Cl.
CPC ............... *G06F 3/041* (2013.01); *C08F 2/44* (2013.01); *C08F 2/48* (2013.01); *G02F 1/13338* (2013.01);
(Continued)

(58) Field of Classification Search
CPC ...... G06F 3/041; G06F 3/044; G06F 1/13338; C08F 2/44; C08F 2/48; G02F 1/13338;
(Continued)

(56) References Cited

U.S. PATENT DOCUMENTS

2005/0237307 A1* 10/2005 Hieda ................... G06F 3/0488
345/173
2013/0213788 A1* 8/2013 Tanabe .................. G06F 3/0445
200/600
(Continued)

FOREIGN PATENT DOCUMENTS

JP    2012-174600 A    9/2012
JP    2013-143059 A    7/2013
(Continued)

OTHER PUBLICATIONS

Notice of Reasons for Refusal dated Jan. 7, 2020, issued by the Japanese Patent Office in Application No. 2018-542333.
(Continued)

*Primary Examiner* — Richard A Booth
(74) *Attorney, Agent, or Firm* — Sughrue Mion, PLLC

(57) ABSTRACT

Provided is a manufacturing method of a touch panel, including: a step of preparing a substrate for a touch panel having a structure in which an electrode and a wiring are disposed on the substrate; a step of providing a photosensitive layer including a specific azole compound on a surface of the substrate for a touch panel where the wiring is disposed; a step of performing pattern-exposing on the photosensitive layer; a step of developing the pattern-exposed photosensitive layer to form a protective layer including an opening for exposing a part of the wiring; a step of providing a colored layer which extends over the protective layer and the wiring exposed to the opening; and a step of performing pattern-exposing and development on the colored layer to form a colored pattern on the protective layer and expose the wiring to the opening.

12 Claims, 2 Drawing Sheets

(51) Int. Cl.
- *G03F 7/09* (2006.01)
- *G03F 7/105* (2006.01)
- *G03F 7/00* (2006.01)
- *C08F 2/48* (2006.01)
- *G03F 7/027* (2006.01)
- *G06F 3/044* (2006.01)

(52) U.S. Cl.
CPC .......... *G03F 7/0035* (2013.01); *G03F 7/0048* (2013.01); *G03F 7/027* (2013.01); *G03F 7/09* (2013.01); *G03F 7/105* (2013.01); *G06F 3/044* (2013.01); *G06F 2203/04103* (2013.01)

(58) Field of Classification Search
CPC ...... G03F 7/0035; G03F 7/0048; G03F 7/027; G03F 7/09; G03F 7/105
See application file for complete search history.

(56) References Cited

U.S. PATENT DOCUMENTS

2014/0111962 A1* 4/2014 Park .................... G06F 3/041
361/818

2015/0109231 A1 4/2015 Shirai et al.
2016/0239117 A1 8/2016 Nakamura et al.

FOREIGN PATENT DOCUMENTS

| JP | 5304973 B1 | 10/2013 |
| JP | 2016-103266 A | 6/2016 |
| JP | 2016-150541 A | 8/2016 |
| JP | 2016-157451 A | 9/2016 |
| WO | 2016/088609 A1 | 6/2016 |

OTHER PUBLICATIONS

International Search Report dated Oct. 3, 2017, issued by the International Searching Authority in application No. PCT/JP2017/032370.

Written Opinion dated Oct. 3, 2017, issued by the International Searching Authority in application No. PCT/JP2017/032370.

International Preliminary Report on Patentability dated Apr. 2, 2019, issued by the International Bureau in application No. PCT/JP2017/032370.

* cited by examiner

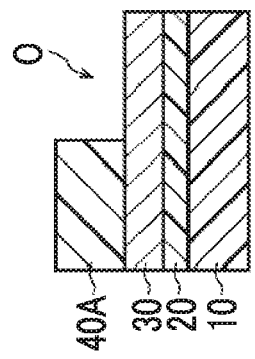
FIG. 1A
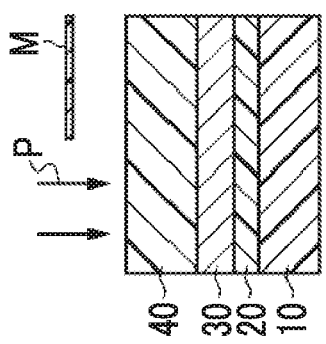
FIG. 1B
FIG. 1C
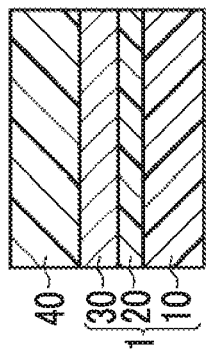
FIG. 1D
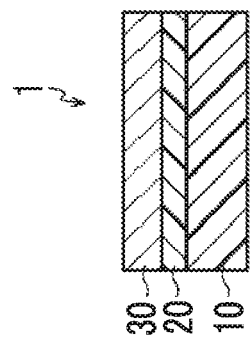
FIG. 1E
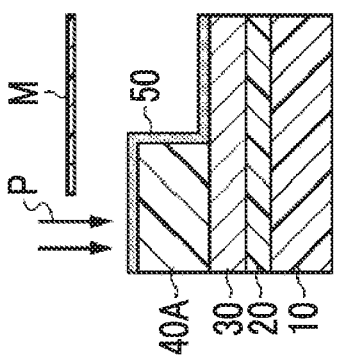
FIG. 1F
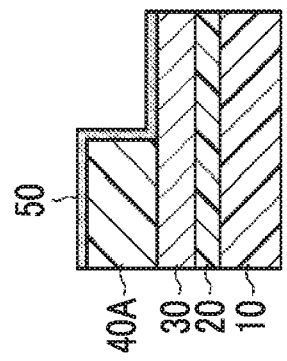
FIG. 1G

MANUFACTURING METHOD OF TOUCH PANEL

CROSS-REFERENCE TO RELATED APPLICATIONS

This application is a continuation application of international Application No. PCT/JP2017/032370, filed Sep. 7, 2017, the disclosure of which is incorporated herein by reference in its entirety. Further, this application claims priority from Japanese Patent Application No. 2016-192277, filed Sep. 29, 2016, the disclosure of which is incorporated herein by reference in its entirety.

BACKGROUND OF THE INVENTION

1. Field of the Invention

The present disclosure relates to a manufacturing method of a touch panel.

2. Description of the Related Art

A touch panel is usually used in a display device of an electronic apparatus (a mobile phone, a car navigator, a personal computer, a ticket vending machine, or a terminal device of a bank) as an input device.

In the touch panel, a protective film for protecting an electrode including a metal wiring may be provided.

For example, a forming method of a protective film of an electrode for a touch panel capable of forming a protective film having sufficient rust inhibiting properties even with a small thickness on the predetermined electrode for a touch panel, including: providing a photosensitive layer formed of a photosensitive resin composition including a binder polymer including a carboxy group and in which an acid value is 30 mgKOH/g to 120 mgKOH/g, a photopolymerizable compound including at least three ethylenically unsaturated groups, and a photopolymerization initiator, on a substrate including an electrode for a touch panel, curing a predetermined portion of the photosensitive layer by emitting an actinic ray and removing a portion other than the predetermined portion, and forming a protective film formed of the cured product of the predetermined portion of the photosensitive layer covering a part or the entire electrode described above (for example, see JP5304973B).

Meanwhile, in a film sensor of a touch panel, a layer including a black pigment or a white pigment may be provided, in order to conceal a wiring pattern or the like provided on a frame portion of the touch panel.

For example, as a transfer film for forming a layer for concealing a wiring pattern or the like on at least one surface of a film sensor, a transfer film including a coloring composition layer, in which a content a (% by mass) and a film thickness b (μm) of a black pigment or a white pigment satisfy an expression 50>a×b>10 (for example, see WO2016/088609A).

SUMMARY OF THE INVENTION

In general, in a manufacturing method of a touch panel, a photosensitive layer is formed so as to cover a wiring for a touch panel disposed on a substrate, the formed photosensitive layer is pattern-exposed, and the pattern-exposed photosensitive layer is developed, to form a cured film (that is, protective layer) on the substrate. An opening (so-called bonding pad portion) for exposing a part of the wiring for a touch panel is formed on the protective layer. In a case where the wiring for a touch panel is exposed, a problem regarding discoloring of the wiring for a touch panel may occur, in a case where a heat treatment such as post baking is performed during a step.

Regarding such a problem, the inventors have confirmed that, in a case where an azole compound is included in the photosensitive layer, the discoloring of the wiring for a touch panel exposed to the opening (bonding pad portion) of the protective layer is prevented.

On the other hand, it was determined that, in a case where an azole compound is included in the photosensitive layer, a colored layer including a colorant or the like is provided on the protective layer, the provided colored layer is pattern-exposed and developed, and a colored pattern is formed on the protective layer, a development residue of the colored layer may be generated in the opening (bonding pad portion) of the protective layer.

The discoloring of the wiring for a touch panel and the generation of the development residue of the colored layer in the opening (bonding pad portion) of the protective layer are not preferable, due to a connection failure from an integrated circuit (IC) controller, for example.

So far, there is no report of problems regarding the discoloring of the wiring for a touch panel and the development residue of the colored layer, which may be generated in the opening (bonding pad portion) of the protective layer of a touch panel including a colored pattern.

An object of the embodiment of the invention is to provide a manufacturing method of a touch panel including a protective layer including an opening for exposing a part of a wiring for a touch panel, on a substrate including the wiring for a touch panel, and a colored pattern provided on this protective layer, in which discoloring of the wiring for a touch panel exposed to the opening and generation of a development residue of a colored layer of the opening are prevented.

Means for achieving the object include the following aspects.

<1> A manufacturing method of a touch panel, comprising: a step of preparing a substrate for a touch panel having a structure in which an electrode for a touch panel and a wiring for a touch panel are disposed on the substrate; a step of providing a photosensitive layer including a radical polymerizable monomer, a radical polymerization initiator, and at least one kind of azole compound selected from the group consisting of an imidazole compound, a triazole compound, a tetrazole compound, a thiazole compound, and a thiadiazole compound, on a surface of the substrate for a touch panel where the wiring for a touch panel is disposed; a step of performing pattern-exposing on the photosensitive layer; a step of developing the pattern-exposed photosensitive layer to form a protective layer including an opening for exposing a part of the wiring for a touch panel; a step of providing a colored layer which includes a colorant, a radical polymerizable monomer, and a radical polymerization initiator, and extends over the protective layer and the wiring for a touch panel exposed to the opening; and a step of performing pattern-exposing and development on the colored layer to form a colored pattern on the protective layer and expose the wiring for a touch panel to the opening.

<2> The manufacturing method of a touch panel according to <1>, in which pKa of conjugate acid of the at least one kind of azole compound selected from the group consisting of an imidazole compound, a triazole compound, a tetrazole compound, a thiazole compound, and a thiadiazole compound is equal to or smaller than 4.00.

<3> The manufacturing method of a touch panel according to <1> or <2>, in which the photosensitive layer includes at least one kind of azole compound selected from the group consisting of an imidazole compound, a triazole compound, and a tetrazole compound.

<4> The manufacturing method of a touch panel according to any one of <1> to <3>, in which the photosensitive layer includes at least one kind of azole compound selected from the group consisting of 1,2,4-triazole, 1,2,3-benzotriazole, and 5-amino-1H-tetrazole.

<5> The manufacturing method of a touch panel according to any one of <1> to <4>, in which the photosensitive layer includes an imidazole compound.

<6> The manufacturing method of a touch panel according to any one of <1> to <5>, in which the photosensitive layer includes a triazole compound.

<7> The manufacturing method of a touch panel according to any one of <1> to <6>, in which the photosensitive layer includes a tetrazole compound.

<8> The manufacturing method of a touch panel according to any one of <1> to <7>, in which the photosensitive layer includes a thiazole compound.

<9> The manufacturing method of a touch panel according to any one of <1> to <8>, in which the photosensitive layer includes a thiadiazole compound.

<10> The manufacturing method of a touch panel according to any one of <1> to <9>, in which a content of the at least one kind of azole compound selected from the group consisting of an imidazole compound, a triazole compound, a tetrazole compound, a thiazole compound, and a thiadiazole compound in the photosensitive layer is 0.1% by mass to 10% by mass with respect to the amount of solid contents of the photosensitive layer.

<11> The manufacturing method of a touch panel according to any one of <1> to <10>, in which a thickness of the photosensitive layer is 0.1 µm to 20 µm.

<12> The manufacturing method of a touch panel according to any one of <1> to <11>, in which, in the step of forming the protective layer, the pattern-exposed photosensitive layer is developed with a developer including at least one kind of azole compound selected from the group consisting of an imidazole compound, a triazole compound, a tetrazole compound, a thiazole compound, and a thiadiazole compound.

According to the one embodiment of the invention, a manufacturing method of a touch panel which includes a protective layer including an opening for exposing a part of a wiring for a touch panel on a substrate including the wiring for a touch panel, and a colored pattern provided on this protective layer, and in which discoloring of the wiring for a touch panel exposed to the opening and generation of a development residue of a colored layer of the opening are prevented, is provided.

BRIEF DESCRIPTION OF THE DRAWINGS

FIG. 1A-1G are schematic step views showing a manufacturing method of a touch panel according to one embodiment of the invention.

DESCRIPTION OF THE PREFERRED EMBODIMENTS

Figure 2:
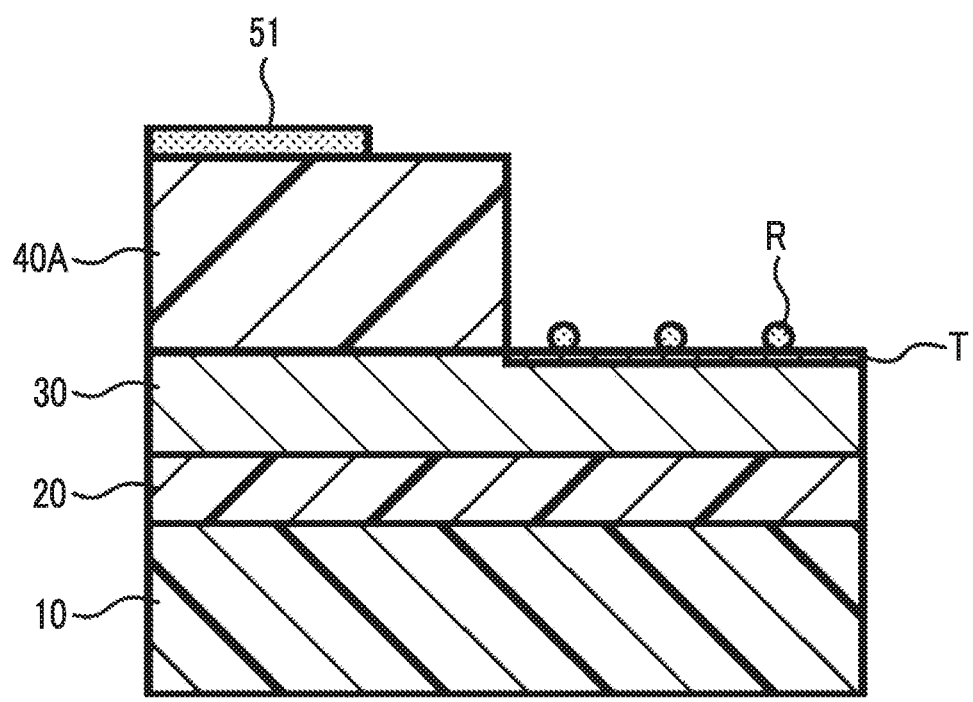
FIG. 2 is a schematic view showing a state where discoloring of a wiring for a touch panel and a development residue of a colored layer are generated in an opening (bonding pad portion) of a protective layer.

Hereinafter, a manufacturing method of a touch panel of this disclosure will be described. However, the invention is not limited to the following embodiments and modifications can be suitably performed within the object of the invention.

In this specification, a range of numerical values shown using "to" means a range including numerical values before and after "to" as the minimum value and the maximum value.

In the range of numerical values shown in stepwise in this specification, an upper limit value or a lower limit value shown in a certain range of numerical values may be replaced with an upper limit value or a lower limit value of another range of numerical values shown in stepwise. In addition, in the range of numerical values shown in this specification, an upper limit value or a lower limit value shown in a certain range of numerical values may be replaced with a value shown in examples.

In this specification, in a case where a plurality of substances corresponding to components are present in the composition, a concentration or a content of each component means a total concentration or content of the plurality of substances, unless otherwise noted.

In this specification, a term "step" not only includes an independent step, but also includes a step, in a case where the step may not be distinguished from the other step, as long as the expected object of the step is achieved.

In this specification, "(meth)acrylic acid" has a concept including both acrylic acid and a methacrylic acid, "(meth)acrylate" has a concept including both acrylate and methacrylate, and "(meth)acryloyl group" has a concept including both acryloyl group and methacryloyl group.

In the specification, "solid contents of a photosensitive layer forming composition" means components other than a solvent in the photosensitive layer forming composition, and the "amount of solid contents of the photosensitive layer forming composition" means a total amount of solid contents in the photosensitive layer forming composition. The same applies to other layer forming compositions, In the specification, "light" has a concept including active energy ray such as a γ ray, a β ray, an electron beam, an ultraviolet ray, a visible light ray, and an infrared ray.

In the specification, a "transparent" state means that a minimum light transmittance at a wavelength of 400 nm to 800 nm is equal to or greater than 80% (preferably equal to or greater than 90% and more preferably equal to or greater than 95%).

[Manufacturing Method of Touch Panel]

A manufacturing method of a touch panel (hereinafter, also simply referred to as a "manufacturing method") of this disclosure includes: a step of preparing a substrate for a touch panel having a structure in which an electrode for a touch panel and a wiring for a touch panel are disposed on the substrate (hereinafter, also referred to as a "preparation step"); a step of providing a photosensitive layer including a radical polymerizable monomer, a radical polymerization initiator, and at least one kind of azole compound selected from the group consisting of an imidazole compound, a triazole compound, a tetrazole compound, a thiazole compound, and a thiadiazole compound (hereinafter, also referred to as a "specific azole compound"), on a surface of the substrate for a touch panel where the wiring for a touch panel is disposed (hereinafter, also referred to as a "photosensitive layer forming step"); a step of performing pattern-exposing of the photosensitive layer (hereinafter, also referred to as a "photosensitive layer exposure step"); a step of developing the pattern-exposed photosensitive layer to form a protective layer including an opening for exposing a part of the wiring for a touch panel (hereinafter, also referred to as a "photosensitive layer development step"); a step of providing a colored layer which includes a colorant, a radical polymerizable monomer, and a radical polymerization initiator, and extends over the protective layer and the wiring for a touch panel exposed to the opening (hereinafter, also referred to as a "colored layer forming step"); and a step of performing pattern-exposing and development of the colored layer to form a colored pattern on the protective layer and expose the wiring for a touch panel to the opening (hereinafter, also referred to as a "colored pattern forming step").

In general, the touch panel includes an image display region in which an image is displayed, and an image non-display region (also referred to as a "frame portion") which is disposed around this image display region. In the touch panel, the electrode (that is, electrode for a touch panel) is a member disposed at least in the image display region of the touch panel, and the wiring (that is, wiring for a touch panel) is a member disposed at least in the image non-display region (frame portion) of the touch panel. The "opening" of the protective layer in the manufacturing method of this disclosure is positioned in the image non-display region (frame portion) of the touch panel, and a part of the wiring for a touch panel is exposed in the opening.

According to the manufacturing method of this disclosure, it is possible to manufacture a touch panel which includes a protective layer including an opening for exposing a part of a wiring for a touch panel on a substrate including the wiring for a touch panel, and a colored pattern provided on this protective layer, and in which discoloring of the wiring for a touch panel exposed to the opening and generation of a development residue of a colored layer of the opening are prevented.

A reason for such effects exhibited by the manufacturing method of this disclosure is not clear, but the inventors have surmised as follows.

In general, in the manufacturing method of the touch panel, a photosensitive layer is formed so as to cover a wiring for a touch panel disposed on a substrate, and the photosensitive layer is pattern-exposed and developed, to form a cured film (that is, protective layer) on the substrate. In the protective layer, an opening (so-called bonding pad portion) for exposing a part of the wiring for a touch panel is formed. In a case where the wiring for a touch panel is exposed, the discoloring is generated in a case where a heat treatment such as post baking is performed during the step.

The discoloring of the wiring for a touch panel can be prevented by including an azole compound in the photosensitive layer. On the other hand, in a case where the azole compound is included in the photosensitive layer, a colored layer is provided on the protective layer, and the provided colored layer is pattern-exposed and developed, to form a colored pattern on the protective layer, a development residue of the colored layer may be generated in the opening (bonding pad portion) of the protective layer.

With respect to this, it is thought that, in the manufacturing method of this disclosure, the specific azole compound is included in the photosensitive layer provided on a surface of the substrate for a touch panel where the wiring for a touch panel is disposed, an unexposed portion of the photosensitive layer is dissolved by the pattern-exposure and development of the photosensitive layer, and accordingly, the specific azole compound included in the photosensitive layer is eluted and adsorbed to the wiring for a touch panel. It is thought that, since the specific azole compound is adsorbed to the wiring for a touch panel, the wiring for a touch panel is protected from the heat treatment during the step and the discoloring of the wiring for a touch panel is prevented.

In addition, it is thought that, in the manufacturing method of this disclosure, the specific azole compound adsorbed to the wiring for a touch panel is a compound which hardly interacts with a component (for example, components included in a colored layer forming composition such as a colorant, a binder, an alkali-soluble resin, or a dispersing agent) which may be included in the colored layer, and accordingly, a development residue of the colored layer, that is, a residue generated due to the interaction between the specific azole compound adsorbed to the wiring for a touch panel and the component included in the colored layer is prevented.

With respect to this, in a touch panel disclosed in JP5304973B, a photosensitive layer including tetrazole including an amino group is formed, but there is no description that a colored layer is provided.

In addition, a film sensor disclosed in WO2016/088609A includes a layer including a colorant and the like, but there is no description that a photosensitive layer includes an azole compound.

Therefore, it is thought that, in JP5304973B and WO2016/088609A, the problem regarding the development residue of the colored layer does not occur, accordingly, the objects of this disclosure are not focused.

The effect of the invention is not limited to the surmise described above, and the surmise is merely an example.

Hereinafter, the outline of the manufacturing method of a touch panel according to the one embodiment of the invention will be described with reference to the drawings. In each drawing, the constituent elements shown with the same reference numeral means the same constituent element.

FIGS. 1A-1G are schematic step views showing the manufacturing method of a touch panel according to the one embodiment of the invention.

In the manufacturing method of a touch panel according to the one embodiment of the invention, first, a substrate for a touch panel 1 having a structure in which a transparent electrode pattern 20 which is a pattern of an electrode for a touch panel and a wiring for a touch panel 30 are disposed on a substrate 10 is prepared (FIG. 1A). A photosensitive layer 40 including a radical polymerizable monomer, a radical polymerization initiator, and a specific azole compound is provided on a surface of the substrate for a touch panel 1 where the wiring for a touch panel 30 is disposed (FIG. 1B). The pattern exposure of irradiating the photosensitive layer 40 provided on the surface of the substrate for a touch panel 1 where the wiring for a touch panel 30 is disposed, with a light ray P through a mask M is performed (FIG. 1C). The pattern-exposed photosensitive layer 40 is developed, to form a protective layer 40A including an opening O for exposing a part of the wiring for a touch panel 30 (FIG. 1D). A colored layer 50 which includes a colorant, a radical polymerizable monomer, and a radical polymerization initiator and extends over the protective layer 40A and the wiring for a touch panel 30 exposed to the opening O is provided (FIG. 1E). The pattern exposure of irradiating the colored layer 50 with the light ray P through the mask M is performed to develop the pattern-exposed colored layer 50 (FIG. 1F). Accordingly, a colored pattern 51 is formed on the protective layer 40A, and the wiring for a touch panel 30 is exposed to the opening O of the protective layer 40A (FIG. 1G). FIG. 1G shows a cross section of a frame portion of the touch panel.

In the manufacturing method of a touch panel according to the one embodiment of the invention, the photosensitive layer 40 including the specific azole compound is provided on the surface of the substrate for a touch panel 1 where the wiring for a touch panel 30 is disposed, and accordingly, it is possible to effectively bring the specific azole compound included in an unexposed portion of the photosensitive layer 40 into contact with the wiring for a touch panel 30, in a case where the photosensitive layer 40 is pattern-exposed and developed. As a result, the wiring for a touch panel 30 is protected by the specific azole compound in a more excellent manner, and accordingly, the discoloring due to the heat treatment is prevented. The specific azole compound adsorbed to the wiring for a touch panel 30 hardly interacts with the component included in the colored layer 50, and accordingly, even in a case where the component included in the unexposed portion of the colored layer is in contact with the specific azole compound adsorbed to the wiring for a touch panel 30, in a case where the colored layer 50 is pattern-exposed and developed, the development residue of the colored layer is hardly generated.

Meanwhile, in a case where the photosensitive layer does not include the azole compound, a discolored region T may be generated on the wiring for a touch panel 30, as shown in FIG. 2. In addition, in a case where the photosensitive layer includes an azole compound other than the specific azole compound, a development residue R of the colored layer may be generated due to the wiring for a touch panel 30 as shown in FIG. 2.

Hereinafter, each step of the manufacturing method of this disclosure will be described in detail. A material and the like for forming a layer provided in each step will be described.

[Preparation Step]

The preparation step is a step for convenience, and is a step of preparing a substrate for a touch panel having a structure in which an electrode for a touch panel and a wiring for a touch panel are disposed on a substrate.

The preparation step may be a step of only simply preparing the substrate for a touch panel manufactured in advance, or may be a step of manufacturing the substrate for a touch panel.

As the substrate, a glass substrate or a resin substrate is preferable.

In addition, the substrate is preferably a transparent substrate and more preferably a transparent resin substrate. The meaning of the transparency is as described above.

A refractive index of the substrate is preferably 1.50 to 1.52.

As the glass substrate, tempered glass such as GORILLA GLASS (registered trademark) manufactured by Corning Incorporated can be used, for example.

As the resin substrate, at least one of a component without optical strains or a component having high transparency is preferably used, and a substrate formed of a resin such as polyethylene terephthalate (PET), polyethylene naphthalate (PEN), polycarbonate (PC), triacetyl cellulose (TAC), polyimide (PI), polybenzoxazole (PBO), or cycloolefin polymer (COP) is used, for example.

As a material of the transparent substrate, a material disclosed in JP2010-086684A, JP2010-152809A, and JP2010-257492A is preferably used.

As the wiring for a touch panel, a leading wiring (lead-out wiring) disposed on the frame portion of the touch panel is used, for example.

As a material of the wiring for a touch panel, metal is preferable. Examples of metal which is the material of the wiring for a touch panel include gold, silver, copper, molybdenum, aluminum, titanium, chromium, zinc, and manganese, and alloy formed of two or more kinds of these metal elements. Among these, as the metal which is the material of the wiring for a touch panel, copper, molybdenum, aluminum, or titanium is preferable, and copper is more preferable, from a viewpoint of electrical resistance.

The copper is easily discolored, but according to the manufacturing method of this disclosure, the discoloring of copper is prevented, even in a case where copper is used as the wiring for a touch panel.

As the electrode for a touch panel, for example, a transparent electrode pattern disposed at least in the image display region of the touch panel is used.

As a material of the transparent electrode pattern, a metal oxide film of indium tin oxide (ITO) and indium zinc oxide (IZO) is preferable.

[Photosensitive Layer Forming Step]

The photosensitive layer forming step is a step of forming a photosensitive layer including a radical polymerizable monomer, a radical polymerization initiator, and at least one kind of azole compound selected from the group consisting of an imidazole compound, a triazole compound, a tetrazole compound, a thiazole compound, and a thiadiazole compound (that is, specific azole compound), on a surface of the substrate for a touch panel on a side where the wiring for a touch panel is disposed.

In this specification, the "imidazole compound" means a compound having an imidazole structure, the "triazole compound" means a compound having a triazole structure, the "tetrazole compound" means a compound having a tetrazole structure, the "thiazole compound" means a compound having a thiazole structure, and the "thiadiazole compound" means a compound having a thiadiazole structure.

In the photosensitive layer forming step, the photosensitive layer provided on the surface of the substrate for a touch panel where the wiring for a touch panel is disposed, includes the specific azole compound, and accordingly, both of the prevention of the discoloring of the wiring for a touch panel and the prevention of the generation of the development residue of the colored layer in the opening (that is, bonding pad portion) of the protective layer can be satisfied.

A content of the specific azole compound in the photosensitive layer is preferably 0.1% by mass to 10% by mass, more preferably 0.2% by mass to 5% by mass, and even more preferably 0.3% by mass to 3% by mass, with respect to the amount of solid contents of the photosensitive layer.

In a case where the content of the specific azole compound in the photosensitive layer is equal to or greater than 0.1% by mass with respect to the amount of solid contents of the photosensitive layer, the discoloring of the wiring for a touch panel tends to be further prevented.

In a case where the content of the specific azole compound in the photosensitive layer is equal to or greater than 10% by mass with respect to the amount of solid contents of the photosensitive layer, the generation of the development residue of the colored layer tends to be further prevented.

A preferred aspect of a component included in the photosensitive layer (the radical polymerizable monomer, the radical polymerization initiator, and the specific azole compound) and a component which may be included in the photosensitive layer is as shown in a photosensitive layer forming composition which will be described later.

A method of providing the photosensitive layer including the radical polymerizable monomer, the radical polymerization initiator, and the specific azole compound on the surface of the substrate for a touch panel where the wiring for a touch panel is disposed, may be a method using a photosensitive layer forming composition which will be described later, or may be a method using a transfer film including the photosensitive layer (hereinafter, also referred to as a "photosensitive layer forming transfer film") which will be described later.

As a preferred method of providing the photosensitive layer on the surface of the substrate for a touch panel where the wiring for a touch panel is disposed, a method using the photosensitive layer forming transfer film is used.

First, in the photosensitive layer forming step, an aspect of using the photosensitive layer forming transfer film will be described.

In this aspect, the photosensitive layer is formed on the surface by laminating the photosensitive layer forming transfer film on the surface of the substrate for a touch panel where the wiring for a touch panel is disposed, and transferring the photosensitive layer of the photosensitive layer forming transfer film on the surface.

The laminating can be performed using a well-known laminator such as a vacuum laminator or an auto-cut laminator.

As the laminating condition, a general condition can be applied.

A laminating temperature is preferably 80° C. to 150° C., more preferably 90° C. to 150° C., and particularly preferably 100° C. to 150° C.

For example, in a case of using a laminator including a rubber roller, the laminating temperature indicates a temperature of the rubber roller.

A temperature of the substrate for a touch panel during the laminating is not particularly limited. The temperature of the substrate for a touch panel during the laminating is, for example, 10° C. to 150° C., preferably 20° C. to 150° C., and more preferably 30° C. to 150° C.

In a case where the substrate is a resin substrate, the temperature of the substrate for a touch panel during the laminating is preferably 10° C. to 80° C., more preferably 20° C. to 60° C., and particularly preferably 30° C. to 50° C.

Linear pressure during the laminating is preferably 0.5 N/cm to 20 N/cm, more preferably 1 N/cm to 10 N/cm, and particularly preferably 1 N/cm to 5 N/cm.

A transportation speed (so-called laminating speed) during the laminating is preferably 0.5 m/min to 5 m/min and more preferably 1.5 m/min to 3 m/min.

For example, in a case of using the transfer film having a laminated structure of the protective an/photosensitive layer/interlayer/thermoplastic resin layer/temporary support, as the photosensitive layer forming transfer film, first, the protective film is peeled off from the photosensitive layer forming transfer film. Then, the photosensitive layer forming transfer film and the substrate for a touch panel are bonded to each other so that the exposed photosensitive layer and the surface of the substrate for a touch panel where the wiring for a touch panel is disposed are in contact with each other, and heating and pressurizing are performed. By performing such an operation, the photosensitive layer of the photosensitive layer forming transfer film is transferred onto the surface of the substrate for a touch panel where the wiring for a touch panel is disposed, and a laminate having a laminated structure of temporary support/thermoplastic resin layer/interlayer/photosensitive layer/wiring for a touch panel/substrate is formed. In this laminated structure, the portion of "wiring for a touch panel/substrate" is the substrate for a touch panel.

After that, the temporary support is peeled off from the laminate, if necessary. However, the pattern exposure which will be described later can be also performed, by leaving the temporary support.

As an example of the method of transferring the photosensitive layer of the photosensitive layer forming transfer film on the substrate for a touch panel and performing pattern exposure and development, a description disclosed in paragraphs 0035 to 0051 of JP2006-023696A can also be referred to.

Next, the aspect using the photosensitive layer forming composition which will be described later, without using the photosensitive layer forming transfer film which will be described later in the photosensitive layer forming step will be described.

As a suitable example of this aspect, the photosensitive layer forming composition which will be described later having the aspect including the solvent is applied and dried on the surface of the substrate for a touch panel where the wiring for a touch panel is disposed, to form the photosensitive layer on the surface.

Specific examples of the coating and drying method are respectively the same as the specific examples of the coating and drying method in a case of forming the photosensitive layer on the temporary support in the photosensitive layer forming transfer film which will be described later.

The heat treatment (so-called pre-baking) may be performed with respect to the photosensitive layer after the drying and before the exposure, if necessary.

A thickness of the photosensitive layer formed in the photosensitive layer forming step is preferably 0.1 µm to 20 µm, more preferably 0.5 µm to 20 µm, even more preferably 2.0 µm to 15 µm, and particularly preferably 4.0 µm to 10.0 µm.

In a case where the thickness of the photosensitive layer is in the range described above, it is advantageous from viewpoints of improving light transmittance of the photosensitive layer or a cured film to be obtained, and preventing the photosensitive layer or a cured film to be obtained from being stained into yellow.

[Photosensitive Layer Exposure Step]

The photosensitive layer exposure step is a step of performing the pattern exposure with respect to the photosensitive layer.

In this specification, the "pattern exposure" indicates exposure of the aspect of performing the exposure in a pattern shape, that is, the aspect in which an exposed portion and an unexposed portion are present.

The exposed portion of the photosensitive layer on the substrate for a touch panel in the pattern exposure is cured and finally becomes the cured film (that is, protective layer).

Meanwhile, the unexposed portion of the photosensitive layer on the substrate for a touch panel in the pattern exposure is not cured, and is removed (dissolved) with a developer in the subsequent development step. With the unexposed portion, the opening of the cured film (that is, protective layer) can be formed after the development step.

The pattern exposure may be exposure through a mask or may be digital exposure using a laser or the like.

As a light source of the pattern exposure, a light source can be suitably selected, as long as it can emit light at a wavelength region (for example, 365 nm or 405 nm) at which the photosensitive layer can be cured.

Examples of the light source include various lasers, an LED, an ultrahigh pressure mercury lamp, a high pressure mercury lamp, and a metal halide lamp. An exposure intensity is, for example, 5 mJ/cm² to 200 mJ/cm², and is preferably 10 mJ/cm² to 200 mJ/cm².

In a case where the photosensitive layer is formed on the substrate using the transfer film, the pattern exposure may be performed after peeling the temporary support, or the exposure may be performed before the peeling the temporary support, and then, the temporary support may be peeled off.

In the exposure step, the heat treatment (so-called post exposure bake (PEB)) may be performed with respect to the photosensitive layer after the pattern exposure and before the development.

[Photosensitive Layer Development Step]

The photosensitive layer development step is a step of developing the pattern-exposed photosensitive layer (that is, dissolving the unexposed portion of the pattern exposure with a developer) to form a protective layer including an opening for exposing a part of the wiring for a touch panel.

A developer used in the development is not particularly limited, and a well-known developer such as a developer disclosed in JP1993-072724A (JP-H5-072724A) can be used.

As the developer, an alkali aqueous solution is preferably used.

Examples of the alkali compound which can be included in the alkali aqueous solution include sodium hydroxide, potassium hydroxide, sodium carbonate, potassium carbonate, sodium hydrogen carbonate, potassium hydrogencarbonate, tetramethyl ammonium hydroxide, tetraethyl ammonium hydroxide, tetrapropyl ammonium hydroxide, tetrabutylammonium hydroxide, and choline (2-hydroxyethyltrimethylammonium hydroxide).

The pH of the alkali aqueous solution at 25° C. is preferably 8 to 13, more preferably 9 to 12, and particularly preferably 10 to 12.

A content of the alkali compound in the alkali aqueous solution is preferably 0.1% by mass to 5% by mass and more preferably 0.1% by mass to 3% by mass with respect to a total mass of the alkali aqueous solution.

The developer preferably includes at least one kind of azole compound selected from the group consisting of an imidazole compound, a triazole compound, a tetrazole compound, a thiazole compound, and a thiadiazole compound (that is, specific azole compound).

Since the developer includes the specific azole compound, the generation of the discoloring of the wiring for a touch panel and the generation of the development residue of the colored layer in the bonding pad portion are further prevented.

The specific azole compound included in the developer may be the same as or different from the specific azole compound included in the photosensitive layer.

In a case where the developer includes the specific azole compound, a content of the specific azole compound in the developer is not particularly limited, and can be suitably set, by considering the content of the specific azole compound included in the photosensitive layer.

For example, the content of the specific azole compound in the developer is preferably 0.005% by mass to 2.5% by mass, more preferably 0.008% by mass to 2.2% by mass, and even more preferably 0.01% by mass to 2.0% by mass with respect to a total mass of the developer.

In a case where the content of the specific azole compound in the developer is in the range described above with respect to a total mass of the developer, both of the prevention of the discoloring of the wiring for a touch panel and the prevention of the generation of the development residue of the colored layer in the opening (that is, bonding pad portion) of the protective layer can be satisfied in an excellent balance.

In addition, the preferred aspect of the specific azole compound in the developer is the same as the preferred aspect of the specific azole compound in the photosensitive layer forming composition which will be described later, and therefore, the description is omitted here.

The developer may include an organic solvent having miscibility with water.

Examples of the organic solvent include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, ε-caprolactone, γ-butyrolactone, dimethylformamide, dimethylacetamide, hexamethylphosphoramide, ethyl lactate, methyl lactate, ε-caprolactam, and N-methylpyrrolidone.

In a case where the developer includes the organic solvent, a concentration of the organic solvent in the developer is preferably 0.1% by mass to 30% by mass.

The developer may include a well-known surfactant.

In a case where the developer includes a surfactant, a concentration of the surfactant in the developer is preferably 0.01% by mass to 10% by mass.

As the developer, a commercially available product can also be used. As the example of the commercially available product of the developer, T-CD1 (product name, sodium carbonate/sodium hydrogen carbonate developer) manufactured by Fujifilm Corporation is used.

Examples of the development method include methods such as puddle development, shower development, shower and spin development, and dip development.

In a case of the shower development, the unexposed portion of the photosensitive layer is removed by spraying the developer to the photosensitive layer after the pattern exposure as a shower. In a case of using the transfer film including at least one of the photosensitive layer, the thermoplastic resin layer, or the interlayer, as the photosensitive layer forming transfer film, an alkali solution having a low solubility of the photosensitive layer may be sprayed as a shower, after the transfer of these layers onto the substrate and before the development of the photosensitive layer, and at least one of the thermoplastic resin layer or the interlayer (both layers, in a case where both layers are present) may be removed in advance.

In addition, after the development, the development residue is preferably removed by spraying a cleaning agent with a shower and rubbing with a brush or the like.

A liquid temperature of the developer is preferably 20° C. to 40° C.

The photosensitive layer development step may include a stage of performing the development, and a stage of performing the heat treatment (hereinafter, also referred to as "post baking") with respect to the cured film obtained by the development.

In a case where the substrate is a resin substrate, a temperature of the post baking is preferably 100° C. to 160° C. and more preferably 130° C. to 160° C.

A resistance value of the transparent electrode pattern can also be adjusted by this post baking.

In the photosensitive layer development step may include a stage of performing the development, and a stage of performing the exposure (hereinafter, also referred to as "post exposure") with respect to the cured film obtained by the development.

In a case where the photosensitive layer development step includes a stage of performing the post exposure and a stage of performing the post baking, the post baking is preferably performed after the post exposure.

Regarding the pattern exposure and the development, a description disclosed in paragraphs 0035 to 0051 of JP2006-023696A can be referred to, for example.

[Colored Layer Forming Step]

The colored layer forming step is a step of providing a colored layer which includes a colorant, a radical polymerizable monomer, and a radical polymerization initiator, and extends over the protective layer and the wiring for a touch panel exposed to the opening.

The preferred aspect of the component which may be included in the colored layer is as shown in the colored layer forming composition which will be described later.

The method of providing the colored layer extending over the protective layer and the wiring for a touch panel exposed to the opening may be a method using a transfer film including the colored layer which will be described later (hereinafter, also referred to as a "colored layer forming transfer film"), or may be a method using the colored layer forming composition which will be described later.

First, in the colored layer forming step, the aspect using the colored layer forming transfer film which will be described later will be described.

In this aspect, the colored layer is formed on the surface by laminating the colored layer forming transfer film at least on the surfaces of the protective layer and the wiring for a touch panel exposed to the opening, and transferring the colored layer of the colored layer forming transfer film onto the surface.

The laminating can be performed using a well-known laminator such as a vacuum laminator or an auto-cut laminator.

As the laminating condition, a general condition can be applied.

A laminating temperature is preferably 80° C. to 150° C., more preferably 100° C. to 150° C., and particularly preferably 110° C. to 150° C.

Linear pressure during the laminating is preferably 50 N/cm to 200 N/cm and more preferably 75 N/cm to 125 N/cm.

A transportation speed (so-called laminating speed) during the laminating is preferably 0.5 m/min to 5 m/min and more preferably 1.5 m/min to 3 m/min.

In a case of using the transfer film having a laminated structure of the protective film/colored layer/interlayer/thermoplastic resin layer/temporary support as the colored layer forming transfer film, first, the protective film is peeled off from the colored layer forming transfer film to expose the colored layer. Then, the colored layer forming transfer film is bonded to the surface so that the exposed colored layer and the surfaces of the protective layer and the wiring for a touch panel exposed to the protective layer are in contact with each other, and heating and pressurizing are performed.

By performing such an operation, a laminate in which the colored layer of the colored layer forming transfer film is transferred onto the surfaces of the protective layer and the wiring for a touch panel exposed to the opening is formed.

After that, the temporary support is peeled off from the laminate, if necessary. However, the pattern exposure which will be described later can be also performed, by leaving the temporary support.

Next, the aspect using the colored layer forming composition which will be described later without using the colored layer forming transfer film which will be described later in the colored layer forming step will be described.

As a suitable example of this aspect, the colored layer forming composition which will be described later of the aspect including the solvent is applied and dried on the surfaces of the protective layer and the wiring for a touch panel exposed to the opening, to form the colored layer on the surface.

Specific examples of the coating and drying method are respectively the same as the specific examples of the coating and drying method in a case of forming the photosensitive layer on the temporary support in the photosensitive layer forming transfer film which will be described later.

The heart treatment (so-called pre-baking) may be performed with respect to the colored layer after the drying and before the exposure, if necessary.

[Colored Pattern Forming Step]

The colored pattern forming step is a step of performing pattern-exposing and development of the colored layer to form a colored pattern on the protective layer and expose the wiring for a touch panel to the opening.

In the colored pattern forming step, the exposed portion of the colored layer formed in the colored layer forming step in the pattern exposure is cured.

The unexposed portion of the colored layer formed in the colored layer forming step in the pattern exposure is not cured, and is removed (dissolved) with a developer, and the opening to which the wiring for a touch panel is exposed, is formed.

In the colored pattern forming step, the colored pattern is formed on the protective layer and the wiring for a touch panel is exposed in the opening, by the pattern exposure and development of the colored layer.

As the colored pattern, a colored pattern for concealing a wiring pattern of the touch panel is used, for example.

The pattern exposure may be exposure through a mask or may be digital exposure using a laser or the like.

As a light source of the pattern exposure, a light source can be suitably selected, as long as it can emit light at a wavelength region (for example, 365 nm or 405 nm) at which the colored layer can be cured.

Examples of the light source include various lasers, an LED, an ultrahigh pressure mercury lamp, a high pressure mercury lamp, and a metal halide lamp. An exposure intensity is, for example, 5 mJ/cm$^2$ to 200 mJ/cm$^2$, and is preferably 10 mJ/cm$^2$ to 150 mJ/cm$^2$.

In a case where the colored layer is formed using the transfer film, the pattern exposure may be performed after peeling the temporary support, or the exposure may be performed before the peeling the temporary support, and then, the temporary support may be peeled off.

In the exposure step, the heat treatment (so-called post exposure bake (PEB)) may be performed with respect to the colored layer after the pattern exposure and before the development.

A developer used in the development is not particularly limited, and a well-known developer such as a developer disclosed in JP1993-072724A (JP-H5-072724A) can be used.

As the developer, an alkali aqueous solution is preferably used.

Specific examples of the alkali compound which can be included in the alkali aqueous solution, the pH of the alkali aqueous solution at 25° C., the content of the alkali compound in the alkali aqueous solution, and the examples of the commercially available product of the developer are the same as the aspects in the photosensitive layer development step described above, and therefore the description is omitted here.

The developer may include an organic solvent having miscibility with water.

Specific examples of the organic solvent and the concentration of the organic solvent are the same as the aspects in the photosensitive layer development step described above, and therefore the description is omitted here.

The developer may include a well-known surfactant.

The concentration of the surfactant is the same as the aspects in the photosensitive layer development step described above, and therefore the description is omitted here.

A liquid temperature of the developer is preferably 20° C. to 40° C.

Examples of the development method include methods such as puddle development, shower development, shower and spin development, and dip development.

In a case of the shower development, the unexposed portion of the colored layer is removed by spraying the developer to the colored layer after the pattern exposure as a shower. In a case of using the transfer film including at least one of the colored layer, the thermoplastic resin layer, or the interlayer, as the colored layer forming transfer film, an alkali solution having a low solubility of the colored layer (for example, triethanol amine-based developer) may be sprayed as a shower, after the transfer of these layers onto the substrate and before the development of the colored layer, and at least one of the thermoplastic resin layer or the interlayer (both layers, in a case where both layers are present) may be removed in advance.

In addition, after the development, the development residue is preferably removed by spraying a cleaning agent with a shower and rubbing with a brush or the like.

[Other Steps]

The manufacturing method of this disclosure may include other steps other than the step described above.

As the other step, a step (for example, washing step) which may be provided in a normal photolithography step can be used.

<Photosensitive Layer Forming Composition>

In the manufacturing method of this disclosure, the photosensitive layer forming composition used in the formation of the photosensitive layer includes a radical polymerizable monomer, a radical polymerization initiator, and at least one kind of azole compound selected from the group consisting of an imidazole compound, a triazole compound, a tetrazole compound, a thiazole compound, and a thiadiazole compound.

The photosensitive layer formed using the photosensitive layer forming composition includes solid contents of the photosensitive layer forming composition.

Hereinafter, the component of the photosensitive layer forming composition will be described in detail.

(Radical Polymerizable Monomer)

The photosensitive layer forming composition includes the radical polymerizable monomer.

In the photosensitive layer forming composition, the radical polymerizable monomer contributes to the improvement of hardness of the cured film.

The radical polymerizable monomer preferably includes di- or higher functional radical polymerizable monomer.

Here, the radical polymerizable group means a monomer including a radical polymerizable group in a molecule and the di- or higher functional radical polymerizable monomer means a monomer including two or more radical polymerizable groups in a molecule.

As the radical polymerizable monomer, an ethylenically unsaturated group (that is, group including an ethylenic double bond) is preferable, and a (meth) acryloyl group is more preferable.

As the radical polymerizable monomer, (meth)acrylate is preferable.

The photosensitive layer forming composition particularly preferably includes a difunctional radical polymerizable monomer (preferably, difunctional (meth)acrylate) and tri- or higher functional radical polymerizable monomer (preferably, tri- or higher functional (meth)acrylate), for example, from a viewpoint of improving the saline heat moisture resistance of the cured film.

The difunctional radical polymerizable monomer is not particularly limited and suitably selected from well-known compounds.

Examples of the difunctional radical polymerizable monomer include tricyclodecane dimethanol di(meth)acrylate, 1,9-nonanediol di(meth)acrylate, 1,6-hexanediol di(meth)acrylate, and polypropylene glycol di(meth)acrylate.

Examples of a commercially available product of the difunctional radical polymerizable monomer include tricyclodecanedimethanol diacrylate (product name: A-DCP, manufactured by Shin-Nakamura Chemical Co., Ltd.), tricyclodecanedimethanol dimethacrylate (product name: DCP, manufactured by Shin-Nakamura Chemical Co., Ltd.), 1,9-nonanediol diacrylate (product name: A-NOD-N, manufactured by Shin-Nakamura Chemical Co., Ltd.), 1,6-hexanediol diacrylate (product name: A-HD-N, manufactured by Shin-Nakamura Chemical Co., Ltd.), and polypropylene glycol diacrylate (product name: ARONIX (registered trademark) M-270, manufactured by Toagosei Co., Ltd.).

The tri- or higher functional radical polymerizable monomer is not particularly limited and can be suitably selected from well-known compounds.

Examples of the tri- or higher functional radical polymerizable monomer include dipentaerythritol tri/tetra/penta/hexa) (meth)acrylate, pentaerythritol (tri/tetra) (meth)acrylate, trimethylolpropane tri(meth)acrylate, ditrimethylolpropane tetra(meth)acrylate, isocyanuric acid (meth)acrylate, and a (meth)acrylate compound of a glycerin tri(meth)acrylate skeleton.

Here, the "(tri/tetra/penta/hexa) (meth)acrylate" has a concept including tri(meth)acrylate, tetra(meth)acrylate, penta(meth)acrylate, and hexa(meth)acrylate, and the "(tri/tetra) (meth)acrylate" has a concept including tri(meth) acrylate and tetra(meth)acrylate.

Examples of the commercially available product of the tri- or higher functional radical polymerizable monomer include pentaerythritol triacrylate (product name: ARONIX (registered trademark) M-305, trifunctional monomer, manufactured by Toagosei Co., Ltd.) and ditrimethylolpropane tetraacrylate (product name: AD-IMP, tetrafunctional monomer, manufactured by Shin-Nakamura Chemical Co., Ltd.).

In addition, examples of the radical polymerizable monomer include a caprolactone-modified compound of a (meth) acrylate compound, an alkylene oxide-modified compound of a (meth)acrylate compound, and ethoxylated glycerin triacrylate.

Examples of the commercially available product of the caprolactone-modified compound of a (meth)acrylate compound, KAYARAD (registered trademark) DPCA-20 (product name, manufactured by Nippon Kayaku Co., Ltd.) and A-9300-1CL (product name, manufactured by Shin-Nakamura Chemical Co., Ltd.).

Examples of the commercially available product of the alkylene oxide-modified compound of a (meth)acrylate compound include KAYARAD (registered trademark) RP-1040 (product name, manufactured by Nippon Kayaku Co., Ltd.), ATM-35E (product name, manufactured by Shin-Nakamura Chemical Co., Ltd.), A-9300 (product name, manufactured by Shin-Nakamura Chemical Co., Ltd.), and EBECRYL (registered trademark) 135 (product name, manufactured by Daicel-Allnex Ltd.).

Examples of the commercially available product of ethoxylated glycerin triacrylate include A-GLY-9E (product name, manufactured by Shin-Nakamura Chemical Co., Ltd.).

As the radical polymerizable monomer, urethane (meth) acrylate (preferably tri- or higher functional urethane (meth) acrylate) is also used.

Examples of the commercially available product of the tri- or higher functional urethane (meth)acrylate include 8UX-015A (product name, 15-functional monomer, manufactured by Taisei Fine Chemical Co., Ltd.), UA-32P (product name, manufactured by Shin-Nakamura Chemical Co., Ltd.), and UA-1100H (product name, manufactured by Shin-Nakamura Chemical Co., Ltd.).

The radical polymerizable monomer preferably includes a polymerizable monomer including acid group, from viewpoints of improvement of alkali solubility (that is, improvement of developability) and improvement of saline heat moisture resistance of the cured film.

Examples of the acid group include a phosphoric acid group, a sulfonic acid group, and a carboxy group. Among these, a carboxy group is preferable as the acid group.

Examples of the radical polymerizable monomer including the acid group include a tri- or tetra-functional radical polymerizable monomer including the acid group (component obtained by introducing a carboxy group to a pentaerythritol tri- and tetra-acrylate [PETA] skeleton (acid value: 80 mgKOH/g to 120 mgKOH/g)), and a penta- to hexa-functional radical polymerizable monomer including the acid group (component obtained by introducing a carboxy group to a dipentaerythritol penta- and hexa-acrylate [DPHA] skeleton (acid value: 25 mgKOH/g to 70 mgKOH/g)).

The tri- or higher functional radical polymerizable monomer including the acid group may be used in combination with the difunctional radical polymerizable monomer including the acid group, if necessary.

In this specification, acid value means a value measured based on the method disclosed in JIS K0070 (1992).

As the radical polymerizable monomer including the acid group, at least one kind selected from the group consisting of di- or higher functional radical polymerizable monomer including a carboxy group and a carboxylic acid anhydride thereof is preferable, from a viewpoint of further improving saline heat moisture resistance of the cured film.

The di- or higher functional radical polymerizable monomer including a carboxy group is not particularly limited and can be suitably selected from well-known compounds.

As the commercially available product of the di- or higher functional radical polymerizable monomer including a carboxy group, ARONIX (registered trademark) TO-2349 (product name, manufactured by Toagosei Co., Ltd.), ARONIX (registered trademark) M-520 (product name, manufactured by Toagosei Co., Ltd.), or ARONIX (registered trademark) M-510 (product name, manufactured by Toagosei Co., Ltd.) can be suitably used.

As the radical polymerizable monomer including the acid group, a polymerizable compound including an acid group disclosed in paragraphs 0025 to 0030 of JP2004-239942A can also be suitably used. The content of this publication is incorporated in this specification.

A weight-average molecular weight (Mw) of the radical polymerizable monomer which can be included in the photosensitive layer forming composition is preferably 200 to 3,000, more preferably 250 to 2,600, and even more preferably 280 to 2,200.

A molecular weight of the radical polymerizable monomer having the minimum molecular weight, among all of the radical polymerizable monomers included in the photosensitive layer forming composition is preferably equal to or greater than 250, more preferably equal to or greater than 280, and even more preferably equal to or greater than 300.

A content of the radical polymerizable monomer having a molecular weight equal to or smaller than 300, among all of the radical polymerizable monomers included in the photosensitive layer forming composition is preferably equal to or smaller than 30% by mass, more preferably equal to or smaller than 25% by mass, and even more preferably equal to or smaller than 20% by mass, with respect to all of the radical polymerizable monomers included in the photosensitive layer forming composition.

In the specification, the weight-average molecular weight (Mw) is measured by gel permeation chromatography (GPC) under the following conditions.

In the measurement of weight-average molecular weight (Mw), a calibration curve is drawn from eight samples of "STANDARD SAMPLES TSK standard, polystyrene" manufactured by Tosoh Corporation: "F-40", "F-20", "F-4", "F-1", "A-5000", "A-2500", "A-1000", "n-propylbenzene".

—Conditions—
GPC: HLC (registered trademark)-8020 GPC (manufactured by Tosoh Corporation)
Column: TSKgel (registered trademark), three Super Multipore HZ-H (manufactured by Tosoh Corporation, 4.6 mmID×15 cm)
Eluent: Tetrahydrofuran (THF)
Sample Concentration: 0.45% by mass
Flow rate: 0.35 mL/min
Sample injected amount: 104
Measurement temperature: 40° C.
Detector: differential refractometer (RI)

The photosensitive layer forming composition may include only one kind of the radical polymerizable monomer, or two or more kinds of radical polymerizable monomer.

A content of the radical polymerizable monomer in the photosensitive layer forming composition is preferably 1% by mass to 70% by mass, more preferably 10% by mass to 70% by mass, even more preferably 20% by mass to 60% by mass, and particularly preferably 20% by mass to 50% by mass with respect to the amount of solid contents of the photosensitive layer forming composition.

In a case where the photosensitive layer forming composition includes the difunctional radical polymerizable monomer and the tri- or higher functional radical polymerizable monomer, the content of the difunctional radical polymerizable monomer in the photosensitive layer forming composition is preferably 10% by mass to 90% by mass, more preferably 20% by mass to 85% by mass, and even more preferably 30% by mass to 80% by mass, with respect to all of the radical polymerizable monomers included in the photosensitive layer forming composition.

In this case, the content of the tri- or higher functional radical polymerizable monomer in the photosensitive layer forming composition is preferably 10% by mass to 90% by mass, more preferably 15% by mass to 80% by mass, and even more preferably 20% by mass to 70% by mass, with respect to all of the radical polymerizable monomers included in the photosensitive layer forming composition.

In this case, the content of the difunctional radical polymerizable monomer in the photosensitive layer forming composition is preferably equal to or greater than 40% by mass and smaller than 100% by mass, more preferably 40% by mass to 95% by mass, and particularly preferably 50% by mass to 90% by mass, with respect to a total content of the difunctional radical polymerizable monomer and the tri- or higher functional radical polymerizable monomer.

In a case where the photosensitive layer forming composition includes the di- or higher functional radical polymerizable monomer, the photosensitive layer forming composition may further include a monofunctional radical polymerizable monomer.

However, in a case where the photosensitive layer forming composition includes the di- or higher functional radical polymerizable monomer, the di- or higher functional radical polymerizable monomer is preferably a main component in the radical polymerizable monomer included in the photosensitive layer forming composition.

Specifically, in a case where the photosensitive layer forming composition includes the di- or higher functional radical polymerizable monomer, the content of the di- or higher functional radical polymerizable monomer is preferably 60% by mass to 100% by mass, more preferably 80% by mass to 100% by mass, particularly preferably 90% by mass to 100% by mass with respect to a total content of the radical polymerizable monomer included in the photosensitive layer forming composition.

In a case where the photosensitive layer forming composition includes the radical polymerizable monomer including the acid group (preferably, di- or higher functional radical polymerizable monomer including a carboxy group or a carboxylic acid anhydride thereof), the content of the radical polymerizable monomer including the acid group is preferably 1% by mass to 50% by mass, more preferably 1% by mass to 20% by mass, and even more preferably 1% by mass to 10% by mass, with respect to the amount of solid contents of the photosensitive layer forming composition.

(Radical Polymerization Initiator)

The photosensitive layer forming composition includes a radical polymerization initiator.

The radical polymerization initiator is not particularly limited, a well-known radical polymerization initiator can be used, and a photo-radical polymerization initiator is preferable.

Examples of the radical polymerization initiator include a radical polymerization initiator including an oxime ester structure (hereinafter, also referred to as an "oxime-based polymerization initiator"), a radical polymerization initiator including an α-aminoalkylphenone structure (hereinafter, also referred to as an "α-aminoalkylphenone-based polymerization initiator), a radical polymerization initiator including an α-hydroxyalkylphenone structure (hereinafter, also referred to as an "α-hydroxyalkylphenone-based polymerization initiator), a radical polymerization initiator including an acylphosphine oxide structure (hereinafter, also referred to as an "acylphosphine oxide-based polymerization initiator), and a photopolymerization initiator including an N-phenylglycine structure (hereinafter, also referred to as an "N-phenylglycine-based photopolymerization initiator").

The radical polymerization initiator preferably includes at least one kind selected from the group consisting of the oxime-based polymerization initiator, the α-aminoalkylphenone-based polymerization initiator, the α-hydroxyalkylphenone-based polymerization initiator, and the N-phenylglycine-based photopolymerization initiator, and more preferably includes at least one kind selected from the group consisting of the oxime-based polymerization initiator, the α-aminoalkylphenone-based polymerization initiator, and the N-phenylglycine-based photopolymerization initiator.

In addition, as the radical polymerization initiator, for example, polymerization initiators disclosed in paragraphs 0031 to 0042 of JP2011-095716A and paragraphs 0064 to 0081 of JP2015-014783A may be used.

As the radical polymerization initiator, a commercially available product can be used.

Examples of the commercially available product of the radical polymerization initiator include 1,2-octanedione, 1-[4-(phenylthio)-, 2-(O-benzoyloxime)] (product name: IRGACURE (registered trademark) OXE-01, manufactured by BASF Japan Ltd.), ethan, 1-[9-ethyl-6-(2-methylbenzoyl)-9H-carbazol-3-yl]-, 1-(0-acetyloxime) (product name: IRGACURE (registered trademark) OXE-02, manufactured by BASF Japan Ltd.), 2-(dimethylamino)-2-[(4-methylphenyl) methyl]-1-[4-(4-morpholinyl) phenyl]-1-butanone (product name: IRGACURE (registered trademark) 379EG, manufactured by BASF Japan Ltd.), 2-methyl-1-(4-methylthiophenyl)-2-morpholinopropan-1-one (product name: IRGACURE (registered trademark) 907, manufactured by BASF Japan Ltd.), 2-hydroxy-1-{4-[4-(2-hydroxy-2-methyl-propionyl)-benzyl] phenyl}-2-methyl-propan-1-one (product name: IRGACURE (registered trademark) 127, manufactured by BASF Japan Ltd.), 2-benzyl-2-dimethylamino-1-(4-morpholinophenyl)-butanone-1 (product name: IRGACURE (registered trademark) 369, manufactured by BASF Japan Ltd.), 2-hydroxy-2-methyl-1-phenyl-propan-1-one (product name: IRGACURE (registered trademark) 1173, manufactured by BASF Japan Ltd.), 1-hydroxy-cyclohexyl-phenyl-ketone (product name: IRGACURE (registered trademark) 184, manufactured by BASF Japan Ltd.), 2,2-dimethoxy-1,2-diphenylethan-1-one (product name: IRGACURE (registered trademark) 651, manufactured by BASF Japan Ltd.), and a product of an oxime ester type (product name: Lunar 6, manufactured by DKSH Management Ltd.).

The photosensitive layer forming composition may include only one kind of the radical polymerization initiator, or two or more kinds of radical polymerization initiator.

A content of the radical polymerization initiator in the photosensitive layer forming composition is not particularly limited.

For example, the content of the radical polymerization initiator in the photosensitive layer forming composition preferably equal to or greater than 0.1% by mass, more preferably equal to or greater than 0.5% by mass, and even more preferably equal to or greater than 1.0% by mass with respect to the amount of solid contents of the photosensitive layer forming composition.

In addition, the content of the radical polymerization initiator in the photosensitive layer forming composition is preferably equal to or smaller than 10% by mass and more preferably equal to or smaller than 5% by mass, with respect to the amount of solid contents of the photosensitive layer forming composition.

Specific Azole Compound

The photosensitive layer forming composition includes at least one kind of compound selected from the group consisting of an imidazole compound, a triazole compound, a tetrazole compound, a thiazole compound, and a thiadiazole compound (that is, specific azole compound).

The specific azole compound contributes to satisfying of both of the prevention of the discoloring of the wiring for a touch panel and the prevention of the generation of the development residue of the colored layer.

The specific azole compound is not particularly limited.

For example, pKa of conjugate acid of the specific azole compound is preferably equal to or smaller than 6.00, more preferably equal to or smaller than 4.00, and even more preferably equal to or smaller than 3.00, from a viewpoint of further preventing the generation of the development residue of the colored layer.

The colored layer includes a component such as a binder or a dispersing agent for dispersing the colorant such as a pigment. In general, these components include an acid group (for example, carboxy group), in many cases. It is surmised that, in a case where the pKa of conjugate acid of the specific azole compound is equal to or smaller than 4.00, acid-salt interaction between the component including an acid group and the specific azole compound is prevented, and accordingly, it is possible to further prevent the generation of the development residue of the colored layer.

A lower limit of the pKa of conjugate acid of the specific azole compound is not particularly limited, and is preferably equal to or greater than −5.00, from a viewpoint of developability.

The pKa of conjugate acid of the specificiation is a calculated value obtained by ACD/ChemSketch (ACD/Labs 8.00 Release Product Version: 8.08).

A molecular weight of the specific azole compound is not particularly limited, and is, for example, preferably equal to or smaller than 1,000.

Hereinafter, specific examples of the specific azole compound are shown. However, the specific azole compound of this disclosure is not limited thereto. In the following specific examples, the value of pKa of conjugate acid of the specific azole compound is shown in a bracket. In the bracket, "pKa of conjugate acid" is simply shown as "pKa".

Examples of the imidazole compound include benzimidazole (pKa: 5.67), 1-methylimidazole (pKa: 7.01), 2-methylimidazole (pKa: 8.15), 4-methylimidazole (pKa: 7.68), 2-mercaptobenzimidazole (pKa: 2.38), 5-amino-2-mercaptobenzimidazole (pKa: 3.02), 2-mercapto-1-methylimidazole (pKa: 3.14), 2-phenylimidazole (pKa: 6.84), 2-ethyl-4-methylimidazole (pKa: 8.42), imidazole (pKa: 7.18), 5,6-dimethylbenzimidazole (pKa: 6.16), 5-ethoxy-2-mercaptobenzimidazole (pKa: 2.63), 2-phenylimidazole (pKa: 6.84), 2-mercapto-5-methylbenzimidazole (pKa: 2.46), 2-mercapto-5-methoxybenzimidazole (pKa: 2.24), 2-mercapto-5-benzimidazolecarboxylic acid (pKa: 1.31), 2-(4-thiazolyl) benzimidazole (pKa: 3.88), 2-amino-1-methylbenzimidazole (pKa: 7.66), 2-aminobenzimidazole (pKa: 7.55), 1-(3-aminopropyl) imidazole (pKa: 9.08), 6-aminobenzimidazole (pKa: 6.37), 5-aminobenzimidazole (pKa: 6.37), and 5-methylbenzimidazole (pKa: 5.98).

Examples of the triazole compound include 1,2,3-benzotriazole (pKa: 1.17), 1-[N,N-bis (2-ethylhexyl) aminomethyl] benzotriazole (pKa: 6.68), 3-mercapto-1,2,4-triazole (pKa: 1.30), 3-amino-5-methylthio-1H-1, 2,4-triazole (pKa: 2.99), carboxybenzotriazole (pKa: −0.06), 2,2'-[[(methyl-1H-benzotriazol-1-yl) methyl] imino] bisethanol (pKa: 5.51), 1-(2,3-dicarboxypropyl) benzotriazole (pKa: 1.21), 1-[(2-ethylhexylamino) methyl] benzotriazole (pKa: 7.74), 2,6-bis [(1H-benzotriazol-1-yl) methyl]-4-methylphenol (pKa: 1.49), 1-(1', 2'-dicarboxyethyl) benzotriazole (pKa: 0.09), and 1,2,4-triazole (pKa: 2.70).

Examples of tetrazole compound include 5-amino-1H-tetrazole (pKa: 1.29), 1H-tetrazole (pKa: −3.02), 1-methyl-5-mercapto-tetrazole (pKa: −2.98), 5-mercapto-1-phenyl-1H-tetrazole (pKa: −4.56), and 5-phenyl-1H-tetrazole (pKa: −2.88).

Examples of the thiazole compound include 2-aminobenzothiazole (pKa: 4.65).

Examples of the thiadiazole compound include 1,3,4-thiadiazole-2,5-dithiol (pKa: −2.11), 2-mercapto-5-methylthio-1,3,4-thiadiazole (pKa: −1.32), 2-mercapto-1,3,4-thiadiazole (pKa: −1.09), 2-amino-5-methylthio-1,3,4-thiadiazole (pKa: 2.12), and 5-amino-1,2,3-thiadiazole (pKa: 0.34).

Among these, as the specific azole compound, at least one kind of azole compound selected from the group consisting of an imidazole compound, a triazole compound, and tetrazole compound is preferable, and at least one kind of azole compound selected from 1,2,4-triazole, 1,2,3-benzotriazole and 5-amino-1H-tetrazole is more preferable, from a viewpoint of further preventing the discoloring of the wiring for a touch panel and the generation of the development residue of the colored layer.

As the specific azole compound, a commercially available product may be used.

As the examples of the commercially available product of the specific azole compound, components shown as C-1 to C-28 f examples which will be described later are used.

The photosensitive layer forming composition may include only one kind of the specific azole compound, or two or more kinds of specific azole compound.

A content of the specific azole compound in the photosensitive layer forming composition is preferably 0.1% by mass to 10% by mass, more preferably 0.2% by mass to 5% by mass, and even more preferably 0.3% by mass to 3% by mass with respect to the amount of solid contents of the photosensitive layer forming composition.

In a case where the content of the specific azole compound in the photosensitive layer forming composition is equal to or greater than 0.1% by mass with respect to the amount of solid contents of the photosensitive layer forming composition, the discoloring of the wiring for a touch panel tends to be further prevented.

In a case where the content of the specific azole compound in the photosensitive layer forming composition is equal to or smaller than 10% by mass with respect to the amount of solid contents of the photosensitive layer forming composition, the generation of the development residue of the colored layer tends to be further prevented.

(Binder)

The photosensitive layer forming composition may include a binder.

The kind of the binder is not particularly limited, and a polymer such as a (meth)acrylic resin, a polysiloxane resin, a polystyrene resin, or a polyimide resin can be used.

As the binder, two or more kinds of polymers can be used in combination.

A polymer which is a binder preferably includes an acid group, from a viewpoint of developability.

Examples of the acid group include a carboxy group, a phosphate group, and a sulfonic acid group. Among these, a carboxy group is preferable as the acid group.

The polymer preferably includes a structural unit including a carboxy group (preferably, structural unit derived from (meth)acrylic acid). In such a case, a percentage of the structural unit including a carboxy group in the polymer is preferably 1% by mol to 50% by mol and more preferably 5% by mol to 35% by mol.

The polymer is preferably a (meth)acrylic resin.

Here, the (meth)acrylic resin indicates a resin including at least one of a structural unit derived from a (meth)acrylic acid and a structural unit derived from (meth)acrylic acid ester.

A total percentage of the structural unit derived from a (meth)acrylic acid and the structural unit derived from (meth)acrylic acid ester in the (meth)acrylic resin is preferably equal to or greater than 30% by mol and more preferably equal to or greater than 50% by mol.

The (meth)acrylic resin preferably includes the structural unit derived from (meth)acrylic acid. In this case, a percentage of the structural unit derived from (meth)acrylic acid in the (meth)acrylic resin is preferably 1% by mol to 50% by mol and more preferably 5% by mol to 35% by mol.

A weight-average molecular weight (Mw) of the polymer (preferably, (meth)acrylic resin. The same applies hereinafter) is preferably 5,000 to 100,000 and more preferably 10,000 to 50,000.

An acid value of the polymer is preferably equal to or greater than 60 mgKOH/g.

As the polymer a carboxy group-containing acrylic resin having an acid value equal to or greater than 60 mgKOH/g is preferably used, among the polymers disclosed in a paragraph 0025 of JP2011-095716A, and paragraphs 0033 to 0052 of JP2010-237589A.

The acid value of the polymer is preferably 60 mgKOH/g to 200 mgKOH/g, more preferably 60 mgKOH/g to 150 mgKOH/g, and even more preferably 60 mgKOH/g to 110 mgKOH/g.

A content of the binder in the photosensitive layer forming composition is preferably 10% by mass to 95% by mass, more preferably 20% by mass to 80% by mass, and particularly preferably 30% by mass to 70% by mass, with respect to the amount of solid contents of the photosensitive layer forming composition.

In the photosensitive layer forming composition, a mass ratio of the total amount of the radical polymerizable monomer with respect to the total amount of the polymer which is the binder [total amount of radical polymerizable monomer/total amount of the polymer] is preferably 0.20 to 0.90, more preferably 0.30 to 0.80, and particularly preferably 0.40 to 0.80, from viewpoints of hardness of the film and fixing properties with an adherend (substrate, temporary support, or the like).

In the photosensitive layer forming composition, a total amount of the total amount of the polymer which is a binder and the total amount of the radical polymerizable monomer is preferably equal to or greater than 60% by mass and more preferably equal to or greater than 70% by mass, with respect to the amount of solid contents of the photosensitive layer forming composition, from viewpoints of developability and fixing properties with an adherend (substrate, temporary support, or the like).

Thermal Crosslinking Compound

The photosensitive layer forming composition may include a thermal crosslinking compound.

In a case where the photosensitive layer forming composition includes a thermal crosslinking compound, the photosensitive layer does not only have photosensitivity (that is, photocuring properties), but also has thermosetting properties.

In a case where the photosensitive layer has both photocuring properties and thermosetting properties, a cured film having excellent hardness can be formed by photocuring, and the hardness of the cured film can be further improved by heat curing after forming the cured film.

The thermal crosslinking compound is preferably a compound including two or more of thermal reactive groups in one molecule. The compound including two or more thermal reactive groups in one molecule is reacted with heat to form a crosslinked structure.

The thermal reactive group of the thermal crosslinking compound is preferably at least one kind selected from the group consisting of an isocyanate group, a ketene group, a blocked isocyanate group, a blocked ketene group, an epoxy group, and an oxetanyl group.

That is, the thermal crosslinking compound particularly preferably includes two or more thermal reactive groups which are at least one kind selected from the group consisting of an isocyanate group, a ketene group, a blocked isocyanate group, a blocked ketene group, an epoxy group, and an oxetanyl group in one molecule.

The thermal crosslinking compound may include a hydrophilic group in one molecule.

Since the thermal crosslinking compound includes a hydrophilic group in one molecule, developability is improved.

The hydrophilic group is not particularly limited, and a group having a structure in which ethylene oxide or propylene oxide is added to a hydroxyl group of any alcohol of methanol, ethanol, butanol, ethylene glycol, and diethylene glycol is used, for example.

The thermal crosslinking compound may be a compound which reacts with acid due to heat.

The thermal crosslinking compound which is a compound reacting with acid due to heat, reacts with an acid group (for example, acid group in the binder) present in a system due to heating. Accordingly, polarity in the system decreases, and therefore, hydrophilicity decreases. Thus, the effect of preventing corrosion of the electrode for a touch panel and the wiring for a touch panel is exhibited.

As the thermal crosslinking compound which is a compound reacting with acid due to heat, a compound which includes a group temporarily inactivated due to a blocking agent (a blocked isocyanate group, a blocked ketene group, and the like) as a thermal reactive group and which can react with acid by dissociating a blocking agent-derived group at a predetermined dissociation temperature is preferable.

The thermal crosslinking compound which is a compound reacting with acid due to heat is preferably a compound having higher reactivity with acid after heating at a temperature higher than 25° C., compared to reactivity with acid at 25° C.

The thermal crosslinking compound which is a compound reacting with acid due to heat is even more preferably a compound including a blocked isocyanate group (hereinafter, referred to as "blocked isocyanate compound") or a compound including a blocked ketene group (hereinafter, referred to as "blocked ketene compound"), and particularly preferably a blocked isocyanate compound.

According to this aspect, in a case where the protective layer described above is formed from the photosensitive layer, corrosion of the wiring (or wiring and electrode) due to the thermal crosslinking compound is prevented.

—Blocked Isocyanate Compound—

The blocked isocyanate compound is preferably a compound having a structure which protects (masks) an isocyanate group of an isocyanate compound (that is, compound including an isocyanate group) with a blocking agent.

The blocked isocyanate compound preferably includes a hydrophilic group in one molecule. The preferred aspect of the hydrophilic group is as described above.

A dissociation temperature of the blocked isocyanate compound is preferably 100° C. to 160° C. and more preferably 130° C. to 150° C.

Here, the dissociation temperature of the blocked isocyanate compound is a "temperature of an endothermic peak accompanied with a deprotection reaction of blocked isocyanate, in a case where the measurement is performed by differential scanning calorimetry (DSC) analysis using a differential scanning calorimetry (product name: DSC 6200, manufactured by Seiko Instruments Inc.)".

Examples of the blocking agent for forming the blocked isocyanate compound (for example, blocked isocyanate compound having a dissociation temperature of 100° C. to 160° C.) include a pyrazole based compound (3,5-dimethylpyrazole, 3-methylpyrazole, 4-bromo-3,5-dimethylpyrazole, or 4-nitro-3,5-dimethylpyrazole), an active methylene based compound (malonic acid diester (dimethyl malonate, diethyl malonate, di n-butyl malonate, di 2-ethylhexyl malonate)), a triazole based compound (1,2,4-triazole), an oxime-based compound (compound having a structure represented by —C(=N—OH)— in one molecule; for example, formaldoxime, acetoaldoxime, acetoxime, methyl ethyl ketoxime, or cyclohexanone oxime).

Among these, as the blocking agent for forming the blocked isocyanate compound, at least one kind selected from the group consisting of an oxime-based compound and a pyrazole-based compound is preferable, and an oxime-based compound is more preferable, from a viewpoint of preservation stability.

From a viewpoint of improving toughness of the cured film and adhesiveness of a substrate, the blocked isocyanate compound preferably has an isocyanurate structure.

The blocked isocyanate compound having an isocyanurate structure is, for example, synthesized by isocyanurating hexamethylene diisocyanate.

Among the blocked isocyanate compound having an isocyanurate structure, the compound having an oxime structure using the oxime-based compound as the blocking agent is preferable, compared to a compound not having an oxime structure, because the dissociation temperature is easily controlled to be in a preferred range and a development residue is easily decreased.

As the blocked isocyanate compound, a blocked isocyanate compound disclosed in paragraphs 0074 to 0085 of JP2006-208824A may be used. The content of this publication is incorporated in the specification.

Specific examples of the blocked isocyanate compound include the following compounds. However, the blocked isocyanate compound is not limited to the following compounds, in the structure of the following compounds, "*" shows a bonding site.

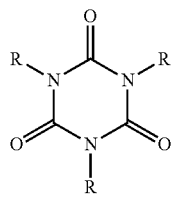

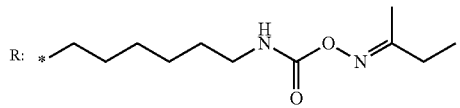

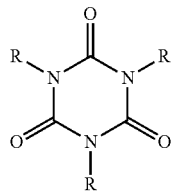

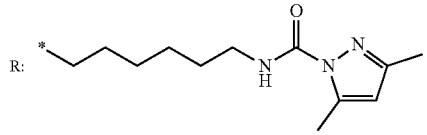

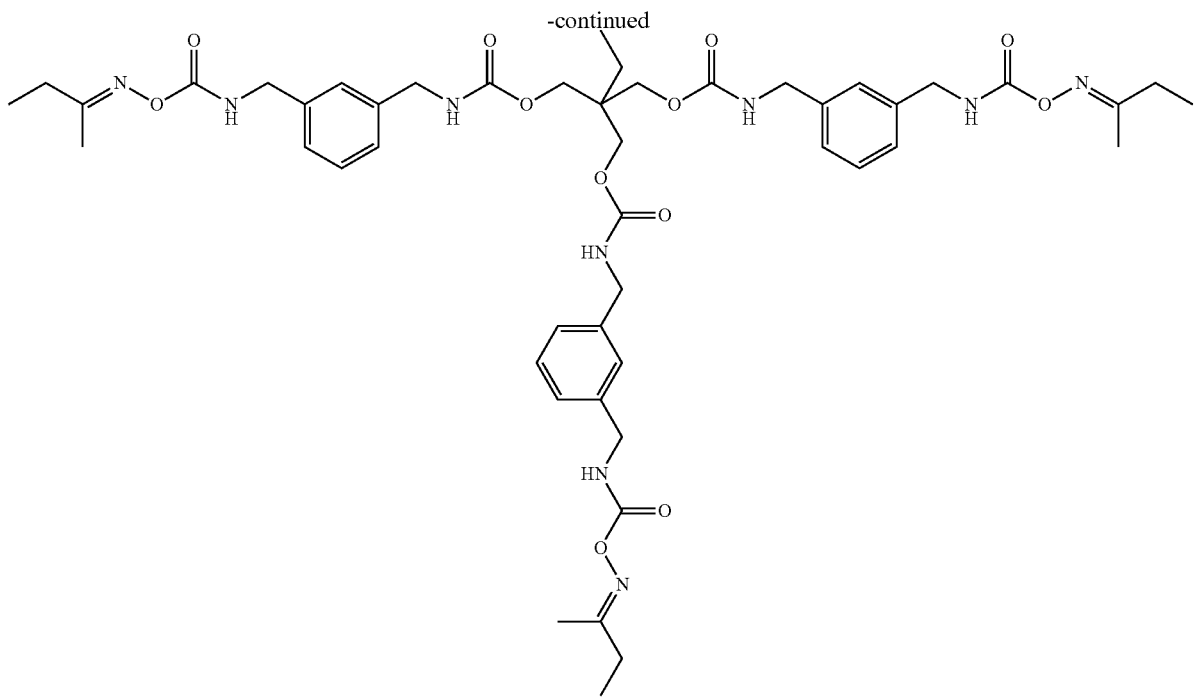

-continued

As the blocked isocyanate compound, a commercially available product may be used.

Examples of the commercially available product of the blocked isocyanate compound include TAKENATE (registered trademark) B870N (product name, manufactured by Mitsui Chemicals, Inc.) which is a methyl ethyl ketone oxime blocked body of isophorone diisocyanate, and DURANATE (registered trademark) MF-K60B, DURANATE (registered trademark) TPA-B80E, and DURANATE (registered trademark) X3071.04 (all manufactured by Asahi Kasei Corporation) which is a hexamethylene diisocyanate-based blocked isocyanate compound.

—Blocked Ketene Compound—

Examples of the blocked ketene compound include a compound having a structure in which a ketene group of a ketene compound (that is, a compound including a ketene group) is protected with a blocking agent, and a compound in which a ketene group is generated due to light or heat.

Specific examples of the blocking agent for forming the blocked ketene compound are the same as the specific examples of the blocking agent for forming the blocked isocyanate compound.

More specific examples of the blocked ketene compound include a compound having a naphthoquinone diazide structure, and a compound having a Meldrum's acid structure.

Examples of the blocked ketene compound include naphthoquinone diazide sulfonic acid ester of 4-{4-[1,1-bis (4-hydroxyphenyl) ethyl]-α,α-dimethylbenzyl}phenol, and naphthoquinone diazide sulfonic acid ester of 2,3,4-trihydroxybenzophenone.

As the blocked ketene compound, a commercially available product may be used.

Examples of the commercially available product of the blocked ketene compound include TAS-200 (product name, manufactured by Toyo Gosei Co., Ltd.) which is naphthoquinone diazide sulfonic acid ester of 4-{4-[1,1-bis (4-hydroxyphenyl) ethyl]-α,α-dimethylbenzyl}phenol.

In addition, naphthoquinone diazide sulfonic acid ester of 2,3,4-trihydroxybenzophenone can also be purchased.

In a case of including the thermal crosslinking compound, the photosensitive layer forming composition may include only one kind of the thermal crosslinking compound, or two or more kinds of thermal crosslinking compound.

In a case where the photosensitive layer forming composition includes the thermal crosslinking compound (for example, the blocked isocyanate compound or the blocked ketene compound), a content of the thermal crosslinking compound in the photosensitive layer forming composition is preferably 1% by mass to 50% by mass, more preferably 5% by mass to 40% by mass, even more preferably 10% by mass to 40% by mass, and particularly preferably 10% by mass to 30% by mass, with respect to the amount of solid contents of the photosensitive layer forming composition.

(Solvent)

The photosensitive layer forming composition layer forming composition may include at least one kind of a solvent, from a viewpoint of forming a photosensitive layer by coating.

As the solvent, a solvent normally used can be used without particular limitations.

The solvent is preferably an organic solvent.

Examples of the organic solvent include methyl ethyl ketone, propylene glycol monomethyl ether, propylene glycol monomethyl ether acetate (another name: 1-methoxy-2-propyl acetate), diethylene glycol ethyl methyl ether, cyclohexanone, methyl isobutyl ketone, ethyl lactate, methyl lactate, caprolactam, n-propanol, and 2-propanol. As the organic solvent, a mixed solvent which is a mixture of these compounds may be used.

As the solvent, a mixed solvent of methyl ethyl ketone and propylene glycol monomethyl ether acetate, or a mixed solvent of diethylene glycol ethyl methyl ether and propylene glycol monomethyl ether acetate is preferable.

In a case where the photosensitive layer forming composition includes the solvent, a content of solid contents of the photosensitive layer forming composition is preferably 1% by mass to 80% by mass, more preferably 3% by mass to 50% by mass, and particularly preferably 5% by mass to 40% by mass, with respect to a total amount of the photosensitive layer forming composition.

In a case where the photosensitive layer forming composition includes the solvent, a viscosity (25° C.) of the photosensitive layer forming composition is preferably 1 mPa·s to 50 mPa·s, more preferably 2 mPa·s to 40 mPa·s, and particularly preferably 3 mPa·s to 30 mPa·s, from a viewpoint of coating properties.

The viscosity is, for example, measured using VISCOMETER TV-22 (product name, manufactured by TOKI SANGYO CO. LTD.).

In a case where the photosensitive layer forming composition includes the solvent, a surface tension (25° C.) of the photosensitive layer forming composition is preferably 5 mN/m to 100 mN/m, more preferably 10 mN/m to 80 mN/m, and particularly preferably 15 mN/m to 40 mN/m, from a viewpoint of coating properties.

The surface tension is, for example, measured using Automatic Surface Tensiometer CBVP-Z (product name, manufactured by Kyowa Interface Science Co., Ltd.).

As the solvent, a solvent disclosed in paragraphs 0054 and 0055 of US2005/282073A1 can also be used. The content of this specification is incorporated in the present specification.

In addition, as the solvent, an organic solvent (so-called high-boiling-point solvent) having a boiling point of 180° C. to 250° C. can also be used, if necessary.

(Surfactant)

The photosensitive layer forming composition may include at least one kind of the surfactant.

As the surfactant, surfactants disclosed in a paragraph 0017 of JP4502784B and paragraphs 0060 to 0071 of JP2009-237362A, a well-known fluorine-based surfactant, and the like can be used.

As the surfactant, a fluorine-based surfactant is preferable.

As a commercially available product of the fluorine-based surfactant, MEGAFACT (registered trademark) F551 (manufactured by DIC Corporation) is used.

In a case where the photosensitive layer forming composition includes the surfactant, a content of the surfactant in the photosensitive layer forming composition is preferably 0.01% by mass to 3% by mass, more preferably 0.05% by mass to 1% by mass, and even more preferably 0.1% by mass to 0.8% by mass with respect to the amount of solid contents of the photosensitive layer forming composition.

(Polymerization Inhibitor)

The photosensitive layer forming composition may include a polymerization inhibitor.

As the polymerization inhibitor, a thermal polymerization inhibitor (also referred to as a polymerization inhibitor) disclosed in a paragraph 0018 of JP4502784B can be used.

As the polymerization inhibitor, phenothiazine, phenoxazine, or 4-methoxyphenol can be suitably used.

The photosensitive layer forming composition may include only one kind of the polymerization inhibitor, or two or more kinds of polymerization inhibitor.

In a case where the photosensitive layer forming composition includes the polymerization inhibitor, a content of the polymerization inhibitor in the photosensitive layer forming composition is preferably 0.01% by mass to 3% by mass, more preferably 0.01% by mass to 1% by mass, and even more preferably 0.01% by mass to 0.8% by mass with respect to the amount of solid contents of the photosensitive layer forming composition.

(Other Components)

The photosensitive layer forming composition may include a component other than the components described above.

Examples of the other components include other additives disclosed in paragraphs 0058 to 0071 of JP2000-310706.

The photosensitive layer forming composition may include at least one kind of particles (for example, metal oxide particles) as the other component, in order to adjust a refractive index or light transmittance.

The metal of the metal oxide particles also includes semimetal such as B, Si, Ge, As, Sb, or Te.

From a viewpoint of transparency of the cured film (that is, protective layer), an average primary particle diameter of the particles is preferably 1 nm to 200 nm and more preferably 3 nm to 80 nm.

The average primary particle diameter of e particles is calculated by measuring particle diameters of 200 random particles using an optical microscope and averaging the measured result. In a case where the shape of the particle is a spherical shape, the longest side is set as the particle diameter.

The content of the particles in the photosensitive layer forming composition is preferably 0% by mass to 35% by mass, more preferably 0% by mass to 10% by mass, even more preferably 0% by mass to 5% by mass, still more preferably 0% by mass to 1% by mass, and particularly preferably 0% by mass (that is, the photosensitive layer forming composition includes no particles), with respect to the amount of solid contents of the photosensitive layer forming composition.

In addition, the photosensitive layer forming composition may include a small amount of colorant (pigment, dye, and the like) as the other component, but it is preferable that a colorant is not substantially included, from a viewpoint of transparency.

Specifically, a content of the colorant in the photosensitive layer forming composition is preferably smaller than 1% by mass and more preferably smaller than 0.1% by mass with respect to the amount of solid contents of the photosensitive layer forming composition.

<Photosensitive Layer Forming Transfer Film>

A photosensitive layer forming transfer film used in the manufacturing method of this disclosure includes a temporary support, and at least the photosensitive layer described above.

Hereinafter, each component which can be included in the photosensitive layer forming transfer film will be described.

(Temporary Support)

The photosensitive layer forming transfer film includes a temporary support.

The temporary support is preferably a film and more preferably a resin film.

As the temporary support, a film which has flexibility and does not generate significant deformation, shrinkage, or stretching under the pressure or under pressure and heating can be used.

Examples of such a film include a polyethylene terephthalate film (for example, biaxial stretching polyethylene terephthalate film), a cellulose triacetate film, a polystyrene film, a polyimide film, and a polycarbonate film.

Among these, a biaxial stretching polyethylene terephthalate film is particularly preferable as the temporary support.

A thickness of the temporary support s not particularly limited, and is, for example, 5 μm to 200 μm.

The thickness of the temporary support is particularly preferably 10 µm to 150 µm, from viewpoints of ease of handling and general-purpose properties.

(Photosensitive Layer)

The photosensitive layer forming transfer film includes at least a photosensitive layer.

The photosensitive layer has photosensitivity (that is, photocuring properties), and may further have thermosetting properties. Examples of means for applying thermosetting properties to the photosensitive layer include means for causing the thermal crosslinking compound described above to be included in the photosensitive layer forming composition described above.

In a case where the photosensitive layer has both photocuring properties and thermosetting properties, hardness of the cured film can be further improved.

The photosensitive layer preferably further has alkali solubility (for example, solubility with respect to weak alkali aqueous solution), from a viewpoint of developability. Examples of means for applying alkali solubility to the photosensitive layer include means for causing a polymer including an acid group to be included in the photosensitive layer forming composition described above as the binder described above.

In addition, the photosensitive layer is preferably a transparent layer.

A thickness of the photosensitive layer is preferably 0.1 µm to 20 µm, more preferably 0.5 µm to 20 µm, even more preferably 2.0 µm to 15 µm, and particularly preferably 4.0 µm to 10.0 µm.

In a case where the thickness of the photosensitive layer is in the range described above, it is advantageous from viewpoints of thinning of the entire transfer film, improvement of light transmittance of the photosensitive layer or the cured film to be obtained, and the prevention of the photosensitive layer or the cured film from being stained into yellow.

A refractive index of the photosensitive layer is preferably 1.47 to 1.56, more preferably 1.50 to 1.53, even more preferably 1.50 to 1.52, and particularly preferably 1.51 to 1.52.

In the specification, the "refractive index" indicates a refractive index at a wavelength of 550 nm.

The "refractive index" in the specification means a value measured with visible light at a wavelength of 550 nm at a temperature of 23° C. by ellipsometry, unless otherwise noted.

A forming method of the photosensitive layer is not particularly limited.

As an example of the forming method of the photosensitive layer, a method of forming the photosensitive layer by applying and, if necessary, drying the photosensitive layer forming composition described above on the temporary support is used.

As the coating method, a well-known method can be used, and examples thereof include a printing method, a spraying method, a roll coating method, a bar coating method, a curtain coating method, a spin coating method, and a die coating method (that is, slit coating method). Among these, a die coating method is preferable as the method of coating.

As the drying method, a well-known method such as natural drying, heating drying, and drying under reduced pressure can be applied alone or in combination of plural thereof.

(Protective Film)

The photosensitive layer forming transfer film may further include a protective film on a side of the photosensitive layer opposite to the temporary support.

In a case where the photosensitive layer forming transfer film includes a refractive index adjusting layer which will be described later on a side of the photosensitive layer opposite to the temporary support, the protective film is preferably disposed on a side of the refractive index adjusting layer opposite to the temporary support.

Examples of the protective film include a polyethylene terephthalate film, a polypropylene film, a polystyrene film, and a polycarbonate film.

As the protective film, a protective film disclosed in paragraphs 0083 to 0087 and 0093 of JP2006-259138A may be used, for example.

(Thermoplastic Resin Layer)

The photosensitive layer forming transfer film may further include a thermoplastic resin layer between a temporary support and a photosensitive layer.

In a case where the photosensitive layer forming transfer film includes the thermoplastic resin layer and the photosensitive layer forming transfer film is transferred to a material to be transferred, to form a laminate, air bubbles are hardly generated on each component of the laminate, in a case where this laminate is used in an image display apparatus, image unevenness is hardly generated and excellent display properties are obtained.

The thermoplastic resin layer preferably has alkali solubility.

The thermoplastic resin layer functions as a cushion material which absorbs ruggedness of the surface of the substrate for a touch panel at the time of transfer. The ruggedness of the surface of the substrate for a touch panel includes an image, an electrode, a wiring, and the like which are formed in advance. The thermoplastic resin layer preferably has properties capable of being deformed in accordance with ruggedness.

The thermoplastic resin layer preferably includes an organic polymer substance disclosed in JP1993-072724A (JP-H5-072724A), and more preferably includes an organic polymer substance having a softening point approximately equal to or lower than 80° C. by a Vicat method (specifically, polymer softening point measurement method using a American Society for Testing and Materials ASTMD 1235).

A thickness of the thermoplastic resin layer is preferably 3 µm to 30 µm, more preferably 4 µm to 25 µm, and even more preferably 5 µm to 20 µm.

In a case where the thickness of the thermoplastic resin layer is equal to or greater than 3 µm, followability with respect to the ruggedness of the surface of the substrate for a touch panel is improved, and accordingly, the ruggedness of the surface of the substrate for a touch panel can be effectively absorbed.

In a case where the thickness of the thermoplastic resin layer is equal to or smaller than 30 µm, process suitability is further improved. Specifically, in a case where the thickness of the thermoplastic resin layer is equal to or smaller than 30 µm, for example, burden of the drying (that is, drying for solvent removal) in a case of applying and forming the thermoplastic resin layer on the temporary support is further reduced, and the development time of the thermoplastic resin layer after the transfer is shortened.

The thermoplastic resin layer can be formed by applying and, if necessary, drying a composition for forming a thermoplastic resin layer including a solvent and a thermoplastic organic polymer on the temporary support.

Specific examples of the coating and drying method are respectively the same as the specific examples of the coating and drying method in a case of forming the photosensitive layer.

The solvent is not particularly limited, as long as a polymer component forming the thermoplastic resin layer is dissolved, and examples thereof, for example, include organic solvents (methyl ethyl ketone, cyclohexanone, propylene glycol monomethyl ether acetate, n-propanol, and 2-propanol).

A viscosity of the thermoplastic resin layer measured at 100° C. is preferably 1,000 Pa·s to 10,000 Pa·s. In addition, the viscosity of the thermoplastic resin layer measured at 100° C. is preferably lower than the viscosity of the photosensitive layer measured at 100° C.

(Interlayer)

The photosensitive layer forming transfer film may further include an interlayer between the temporary support and the photosensitive layer.

In a case where the photosensitive layer forming transfer film includes the thermoplastic resin layer, the interlayer is preferably disposed between the thermoplastic resin layer and the photosensitive layer.

As the component of the interlayer, a resin which is a mixture including polyvinyl alcohol, polyvinyl pyrrolidone, cellulose, or at least two kinds thereof is used.

In addition, as the interlayer, a component disclosed in JP1993-072724A (JP-H5-072724A) as a "separation layer" can also be referred to.

In a case of manufacturing the transfer film of the aspect including the thermoplastic resin layer, the interlayer, and the photosensitive layer on the temporary support in this order, the interlayer can be, for example, formed by applying and, if necessary, drying a composition for forming an interlayer including a solvent which does not dissolve the thermoplastic resin layer, and the resin as the component of the interlayer, on the thermoplastic resin layer.

Specific examples of the coating and drying method are respectively the same as the specific examples of the coating and drying method in a case of forming the photosensitive layer.

In a case of the photosensitive layer forming transfer film of the aspect, first, the composition for forming a thermoplastic resin layer is applied and dried on the temporary support to form the thermoplastic resin layer. Next, the composition for forming an interlayer is applied and dried on this thermoplastic resin layer to form the interlayer. After that, the photosensitive layer forming composition described above is applied and dried on the interlayer to form the photosensitive layer. A solvent included in the photosensitive layer forming composition is preferably a solvent which does not dissolve the interlayer.

(Refractive Index Adjusting Layer)

The photosensitive layer forming transfer film may further include a refractive index adjusting layer on a side of the photosensitive layer opposite to a side where the temporary support is present.

According to the photosensitive layer forming transfer film of the aspect including the refractive index adjusting layer, in a case of forming a protective layer for a touch panel by transferring the refractive index adjusting layer and the photosensitive layer of the photosensitive layer forming transfer film to a substrate for a touch panel including a transparent electrode pattern, the transparent electrode pattern is more hardly recognized (that is, concealing properties of the transparent electrode pattern are further improved). A phenomenon that the transparent electrode pattern is recognized, is generally referred to as "see-through"

Regarding the phenomenon that the transparent electrode pattern is recognized, and the concealing properties of the transparent electrode pattern, JP2014-010814A and JP2014-108541A can be suitably referred to.

The refractive index adjusting layer is preferably disposed to be adjacent to the photosensitive layer.

The refractive index of the refractive index adjusting layer is preferably higher than the refractive index of the photosensitive layer.

The refractive index of the refractive index adjusting layer is preferably equal to or greater than 1.50, more preferably equal to or greater than 1.55, and particularly preferably equal to or greater than 1.60.

An upper limit of the refractive index of the refractive index adjusting layer is not particularly limited, and is preferably equal to or smaller than 2.10, more preferably equal to or smaller than 1.85, even more preferably equal to or smaller than 1.78, and particularly preferably equal to or smaller than 1.74.

The refractive index adjusting layer may have photocuring properties (that is, photosensitivity), may have thermosetting properties, or may have both photocuring properties and thermosetting properties.

From a viewpoint of forming the cured film having excellent hardness by the photocuring after the transfer, the refractive index adjusting layer preferably has photocuring properties.

From viewpoints of further improving hardness of the cured film by the heat curing, the refractive index adjusting layer preferably has thermosetting properties.

The refractive index adjusting layer preferably has thermosetting properties and photocuring properties.

The refractive index adjusting layer preferably has alkali solubility (for example, solubility with respect to weak alkali aqueous solution).

In addition, the refractive index adjusting layer is preferably a transparent layer.

The aspect in which the refractive index adjusting layer has photosensitivity, has an advantage, from a viewpoint of collectively patterning the photosensitive layer and the refractive index adjusting layer transferred onto the substrate for a touch panel by photolithography at one time, after the transferring.

A thickness of the refractive index adjusting layer is preferably equal to or smaller than 500 nm, more preferably equal to or smaller than 110 nm, and particularly preferably equal to or smaller than 100 nm.

In addition, the thickness of the refractive index adjusting layer is preferably equal to or greater than 20 nm, more preferably equal to or greater than 50 nm, even more preferably equal to or greater than 55 nm, and particularly preferably equal to or greater than 60 nm.

The film thickness of the refractive index adjusting layer is even more preferably 50 nm to 100 nm, still more preferably 55 nm to 100 nm, and particularly preferably 60 nm to 100 nm.

The refractive index of the refractive index adjusting layer is preferably adjusted in accordance with the refractive index of the transparent electrode pattern.

In a case where the refractive index of the transparent electrode pattern is 1.8 to 2.0, as in a case of the transparent electrode pattern formed of ITO, the refractive index of the refractive index adjusting layer is preferably equal to or greater than 1.60.

An upper limit of the refractive index of the refractive index adjusting layer in this case is not particularly limited, and is preferably equal to or smaller than 2.1, more preferably equal to or smaller than 1.85, even more preferably equal to or smaller than 1.78, and particularly preferably equal to or smaller than 1.74.

In addition, in a case where the refractive index of the transparent electrode pattern is greater than 2.0, as in a case of the transparent electrode pattern formed of indium zinc oxide (IZO), for example, the refractive index of the refractive index adjusting layer is preferably 1.70 to 1.85.

A method of controlling the refractive index of the refractive index adjusting layer is not particularly limited, and examples thereof include a method using a resin having a predetermined refractive index alone, a method using a resin and metal oxide particles and metal particles, and a method using a composite of metal salt and a resin.

The refractive index adjusting layer preferably includes at least one kind selected from the group consisting of inorganic particles having a refractive index equal to or greater than 1.50 (more preferably equal to or greater than 1.55, and particularly preferably equal to or greater than 1.60), a resin having a refractive index equal to or greater than 1.50 (more preferably equal to or greater than 1.55, and particularly preferably equal to or greater than 1.60), and a polymerizable monomer having a refractive index equal to or greater than 1.50 (more preferably equal to or greater than 1.55, and particularly preferably equal to or greater than 1.60).

According to this aspect, the refractive index of the refractive index adjusting layer is easily adjusted to be equal to or greater than 1.50 (more preferably equal to or greater than 1.55, and particularly preferably equal to or greater than 1.60).

In addition, the refractive index adjusting layer preferably includes a binder a polymerizable monomer, and particles.

Regarding the components of the refractive index adjusting layer, components of a curable transparent resin layer disclosed in paragraphs 0019 to 0040 and 0144 to 0150 of JP2014-108541 A, and components of a transparent layer disclosed in paragraphs 0024 to 0035 and 0110 to 0112 of JP2014-010814A, and components of a composition including ammonium salt disclosed in paragraphs 0034 to 0056 of WO2016/009980 can be referred to.

In addition, the refractive index adjusting layer preferably includes at least one kind of a metal oxide suppressing agent.

In a case where the refractive index adjusting layer includes the metal oxide suppressing agent, surface treatment can be performed with respect to a member (for example, conductive member formed on a substrate) in a direct contact with the refractive index adjusting layer, in a case of transferring the refractive index adjusting layer onto the substrate (that is, a target to be transferred). This surface treatment applies a metal oxide suppressing function (protection properties) with respect to the member in a direct contact with the refractive index adjusting layer.

The metal oxide suppressing agent is preferably a compound having an "aromatic ring including nitrogen atoms in a molecule". The compound having an "aromatic ring including nitrogen atoms in a molecule" may include a substituent.

The "aromatic ring including nitrogen atoms in a molecule" is preferably an imidazole ring, a triazole ring, a tetrazole ring, a thiazole ring, a thiadiazole ring, or a fused ring of any one thereof and another aromatic ring, and more preferably an imidazole ring, a triazole ring, a tetrazole ring, or a fused ring of any one thereof and another aromatic ring.

The "another aromatic ring" forming the fused ring may be a homocyclic ring or a heterocyclic ring, and is preferably a homocyclic ring, more preferably a benzene ring or a naphthalene ring, and even more preferably a benzene ring.

As the metal oxide suppressing agent, at least one kind selected from the group consisting of imidazole, benzoimidazole, tetrazole, 5-amino-1H-tetrazole, mercaptothiadiazole, 1,2,3-triazole, 1,2,4-triazole, and 1,2,3-benzotriazole is preferable, and at least one kind selected from the group consisting of imidazole, benzoimidazole, 5-amino-1H-tetrazole, 1,2,3-triazole, 1,2,4-triazole, and 1,2,3-benzotriazole is more preferable.

As the metal oxide suppressing agent, a commercially available product may be used. As the commercially available product, BT-120 manufactured by Johoku Chemical Co., Ltd. including 1,2,3-benzotriazole can be preferably used, for example.

In a case where the refractive index adjusting layer includes the metal oxide suppressing agent, a content of the metal oxide suppressing agent is preferably 0.1% by mass to 20% by mass, more preferably 0.5% by mass to 10% by mass, and even more preferably 1% by mass to 5% by mass with respect to the amount of solid contents of the refractive index adjusting layer.

The refractive index adjusting layer may include a component other than the component described above.

The other component which can be included in the refractive index adjusting layer is the same as the other component which can be included in the photosensitive layer forming composition described above.

The refractive index adjusting layer preferably includes a surfactant as the other component.

A forming method of the refractive index adjusting layer is not particularly limited.

As an example of the forming method of the refractive index adjusting layer, a method of forming the layer of high refractive index by applying and, if necessary, drying a composition for forming the refractive index adjusting layer of the aspect including an aqueous solvent, on the photosensitive layer formed on the temporary support is used.

Specific examples of the coating and drying method are respectively the same as the specific examples of the coating and drying method in a case of forming the photosensitive layer.

The composition for forming the refractive index adjusting layer can include each component of the refractive index adjusting layer described above.

The composition for forming the refractive index adjusting layer, for example, includes a binder a polymerizable monomer, particles, and an aqueous solvent.

In addition, as the composition for forming the refractive index adjusting layer, a composition including ammonium salt disclosed in paragraphs 0034 to 0056 of WO2016/009980A is also preferable.

<Colored Layer Forming Composition>

In the manufacturing method of the disclosure, the colored layer forming composition used in the formation of the colored layer includes at least a colorant, a radical polymerizable monomer, and a radical polymerization initiator.

The colored layer formed using the colored layer forming composition includes solid contents of the colored layer forming composition.

Hereinafter, the components of the colored layer forming composition will be described in detail.

(Colorant)

The colored layer forming composition includes a colorant.

The colorant is not particularly limited, a well-known colorant (pigment, dye, and the like) can be used, and a pigment is preferable.

As the pigment, a surface-treated pigment (pigment having a pigment surface treated with a dispersing agent of a resin and a pigment derivative, or self dispersion pigment including a hydrophilic group (for example, a carboxy group, a phosphoric acid group, or a sulfonic acid group) on a surface of a particle) is also used. In addition, as the pigment, a commercially available pigment dispersion may be used.

The pigment may be suitably selected in accordance with a desired color tone, and can be selected from a black pigment, a white pigment, and a chromatic color pigment other than black and White. For example, in a case of forming a black pattern, a black pigment is suitably selected as the pigment.

The black pigment is not particularly limited, and a well-known black pigment (organic pigment or inorganic pigment) can be used.

As the black pigment, for example, at least one kind selected from the group consisting of carbon black, titanium oxide, titanium carbide, iron oxide, titanium oxide, and graphite is preferable, and carbon black is particularly preferable, from a viewpoint of an optical density.

As the carbon black, for example, carbon black having a surface, at least a part of which is coated with a resin (so-called resin-coated carbon black) is preferable, from a viewpoint of surface electrical resistance.

The black pigment (preferably, carbon black) is preferably used in an aspect of a dispersion liquid.

The dispersion liquid may be produced by adding a mixture obtained by mixing a black pigment and a pigment dispersing agent in advance, to an organic solvent (or vehicle) and dispersing with a dispersion device.

The pigment dispersing agent may be selected in accordance with the pigment and the solvent, and for example, a commercially dispersing agent can be used. Here, the "vehicle" indicates a portion of a medium which disperses the pigment, in a case of obtaining the dispersion liquid, includes a liquid binder component holding the black pigment in a dispersed state, and a solvent component (that is, organic solvent) which causes dissolving and diluting of the binder component.

The dispersing device is not particularly limited, and examples thereof include well-known dispersing device such as a kneader, a roll mill, an attritor, a super mill, a dissolver, a homomixer, or a sand mill.

After the dispersion, fine pulverization may be performed using a friction force by a mechanical attrition.

For the dispersing device and the fine pulverization, a description disclosed in "Pigment Encyclopedia" (Asakura Shoten, First Edition, Asakura Shoten, 2000, pp. 310 and pp. 438) can be referred to.

A particle diameter of the black pigment is preferably 0.001 μm to 0.1 μm and more preferably 0.01 μm to 0.08 μm as a number average particle diameter, from a viewpoint of dispersion stability.

Here, the "particle diameter" indicates a diameter of a circle, in a case where an area of a pigment particle is acquired from an image of the pigment particle imaged with an electron microscope and the circle having the same area as the area of the pigment particle is concerned, and the "number average particle diameter" is an average value obtained by acquiring particle diameters of 100 random particles and averaging the acquired 100 particle diameters.

The colored layer forming composition preferably further includes a chromatic color pigment other than the black pigment and the white pigment, from a viewpoint of transfer properties.

In a case where the colored layer forming composition includes the chromatic color pigment, the chromatic color pigment which is dispersed in the colored layer forming composition in an excellent manner is preferable. From such a viewpoint, a particle diameter of the chromatic color pigment is preferably equal to or smaller than 0.1 μm and more preferably equal to or smaller than 0.08 μm.

As the chromatic color pigment, a chromatic color pigment disclosed in a paragraph 0026 of WO2016/088609A can be preferably used.

A content of the colorant in the colored layer forming composition is preferably 10% by mass to 50% by mass, more preferably 15% by mass to 40% by mass, and even more preferably 20% by mass to 35% by mass, with respect to the amount of solid contents of the colored layer forming composition.

In a case where the colored layer forming composition includes pigments (white pigment and chromatic color pigment) other than the black pigment, a content of the pigment other than the black pigment in the colored layer forming composition is preferably equal to or smaller than 30% by mass, more preferably 1% by mass to 20% by mass, and even more preferably 3% by mass to 15% by mass, with respect to the content of the black pigment.

(Radical Polymerizable Monomer)

The colored layer forming composition includes a radical polymerizable monomer.

In the colored layer forming composition, the radical polymerizable monomer contributes to the improvement of hardness of the cured film of the colored layer.

The preferred aspect of the radical polymerizable monomer of the colored layer forming composition is the same as the preferred aspect of the radical polymerizable monomer of the photosensitive layer forming composition described above, and therefore, the description is omitted here.

(Radical Polymerization Initiator)

The colored layer forming composition includes a radical polymerization initiator.

The radical polymerization initiator is not particularly limited, and a well-known radical polymerization initiator can be used.

The preferred aspect of the radical polymerization initiator of the colored layer forming composition is the same as the preferred aspect of the radical polymerization initiator of the photosensitive layer forming composition described above, and therefore, the description is omitted here.

(Binder)

The colored layer forming composition may include a binder.

The kind of the binder is not particularly limited, and a polymer such as a (meth)acrylic resin, a polysiloxane resin, a polystyrene resin, or a polyimide resin can be used.

As the binder, two or more kinds of polymer can be used in combination.

The preferred aspect of the binder of the colored layer forming composition is the same as the preferred aspect of the binder of the photosensitive layer forming composition described above, and therefore, the description is omitted here.

(Thermal Crosslinking Compound)

The colored layer forming composition may include a thermal crosslinking compound.

In a case where the colored layer forming composition further includes the thermal crosslinking compound, the colored layer has not only photosensitivity (that is, photocuring properties), but also thermosetting properties.

In a case where the colored layer has both photocuring properties and thermosetting properties, a cured film having excellent hardness can be formed by photocuring, and the hardness of the cured film can be further improved by heat curing after forming the cured film.

The preferred aspect of the thermal crosslinking compound of the colored layer forming composition is the same as the preferred aspect of the thermal crosslinking compound of the photosensitive layer forming composition described above, and therefore, the description is omitted here.

(Solvent)

The colored layer forming composition may include at least one kind of a solvent, from a viewpoint of forming a colored layer by coating.

As the solvent, a solvent normally used can be used without particular limitations.

The preferred aspect of the solvent of the colored layer forming composition is the same as the preferred aspect of the solvent of the photosensitive layer forming composition described above, and therefore, the description is omitted here.

(Other Components)

The colored layer forming composition may include a component other than the components described above.

Examples of the other components include a surfactant, a polymerization inhibitor, and particles (for example, metal oxide particles). Examples of the other components include other additives disclosed in paragraphs 0058 to 0071 of JP2000-310706.

The preferred aspect of the surfactant, the polymerization inhibitor, and the particles of the colored layer forming composition is the same as the preferred aspect of the surfactant, the polymerization inhibitor, and the particles of the photosensitive layer forming composition described above, and therefore, the description is omitted here.

<Colored Layer Forming Transfer Film>

The colored layer forming transfer film used in the manufacturing method of the disclosure includes a temporary support and at least the colored layer described above.

Hereinafter, each component which can be included in the colored layer forming transfer film will be described.

(Temporary Support)

The colored layer forming transfer film includes a temporary support.

The preferred aspect of the temporary support of the colored layer forming transfer film is the same as the preferred aspect of the temporary support of the photosensitive layer forming transfer film described above, and therefore, the description is omitted here.

(Colored Layer)

The colored layer forming transfer film includes at least a colored layer.

The colored layer has not only photosensitivity (that is, photocuring properties), but also thermosetting properties. Examples of means for applying thermosetting properties to the colored layer include means for causing the thermal crosslinking compound described above to be included in the colored layer forming composition described above.

In a case where the colored layer has both photocuring properties and thermosetting properties, hardness of the cured film can be further improved.

The colored layer preferably further has alkali solubility (for example, solubility with respect to weak alkali aqueous solution), from a viewpoint of developability. Examples of means for applying alkali solubility to the colored layer include means for causing a polymer including an acid group to be included in the colored layer forming composition described above as the binder described above.

A thickness of the colored layer is preferably 0.5 µm to 10 µm, more preferably 1.0 µm to 5.0 µm, and even more preferably 2.0 µm to 4.0 µm.

In a case where the thickness of the colored layer is in the range described above, it is advantageous from viewpoints of thinning of the entire transfer film, developability, and planar defect (pinhole).

The forming method of the colored layer is not particularly limited.

As an example of the forming method of the colored layer, a method of forming the colored layer by applying and, if necessary, drying the colored layer forming composition described above on the temporary support is used.

Specific examples of the coating and drying method are respectively the same as the specific examples of the coating and drying method in a case of forming the photosensitive layer.

(Protective Film)

The colored layer forming transfer film may further include a protective film on a side of the colored layer opposite to the temporary support.

The specific examples of the protective film of the colored layer forming transfer film are the same as the protective film of the photosensitive layer forming transfer film described above, and therefore, the description is omitted here.

(Thermoplastic Resin Layer)

The colored layer forming transfer film may further include a thermoplastic resin layer between a temporary support and a colored layer.

In a case where the colored layer forming transfer film includes the thermoplastic resin layer and the colored layer forming transfer film is transferred to material to be transferred to form a laminate, air bubbles are hardly generated on each component of the laminate.

The thermoplastic resin layer functions as a cushion material which absorbs ruggedness of the surface of the substrate for a touch panel, during the transfer. The ruggedness of the surface of the substrate for a touch panel also includes an image, an electrode, a wiring, and the like which are formed in advance. The thermoplastic resin layer preferably has properties capable of being deformed in accordance with ruggedness.

The preferred aspect of the thermoplastic resin layer of the colored layer forming transfer film is the same as the preferred aspect of the thermoplastic resin layer of the photosensitive layer forming transfer film described above, and therefore, the description is omitted here. In addition, the forming method of the thermoplastic resin layer of the colored layer forming transfer film is the same as the forming method of the thermoplastic resin layer of the photosensitive layer forming transfer film described above, and therefore, the description is omitted here.

(Interlayer)

The colored layer forming transfer film may further include an interlayer between the temporary support and the colored layer.

In a case where the colored layer forming transfer film includes the thermoplastic resin layer, the interlayer is preferably disposed between the thermoplastic resin layer and the colored layer.

The component of the interlayer of the colored layer forming transfer film is the same as the component of the interlayer of the photosensitive layer forming transfer film described above, and therefore, the description is omitted here. In addition, the forming method of the interlayer of the colored layer forming transfer film is the same as the forming method of the interlayer of the photosensitive layer forming transfer film described above, and therefore, the description is omitted here.

EXAMPLES

Hereinafter, the invention is specifically described with reference to examples, but the invention is not limited to the following examples, within a range not departing the gist of thereof.

Examples 1 to 43 and Comparative Examples 1 and 2

<Preparation of Photosensitive Layer Forming Composition (Materials A-1 to A-43, Material a-1 and Material a-2)>

As the material (that is, photosensitive layer forming composition) for forming the photosensitive layer of the photosensitive layer forming transfer film, materials A-1 to A-43, a material a-1, and a material a-2 having compositions shown in Tables 3 to 8 were prepared. Specifically, the materials were stirred and mixed as the composition shown in Tables 3 to 8, and the obtained mixture was prepared by filtering using a filter made of polytetrafluoroethylene (hole diameter: 0.3 μm).

Details of C-1 to C-28 and P-1 used in the preparation of the materials A-1 to A-43, the material a-1, and the material a-2 are shown in Table 1 and Table 2.

TABLE 1

| | Compound name | Structural Formula | Classification | pKa of conjugate acid |
|---|---|---|---|---|
| C-1 | Benzoimidazole (Tokyo Chemical Industry Co., Ltd.) | | Imidazole compound | 5.67 |
| C-2 | 2-Methylimidazole (Product name: 2MZ-H, Shikoku Chemicals Corporation) | | Imidazole compound | 8.15 |
| C-3 | 2-Mercaptobenzimidazole (Product name: MB, Kawaguchi-Kasei Chemical Industry Co., Ltd ) | | Imidazole compound | 2.38 |
| C-4 | 5-Amino-2-mercaptobenzimidazole (Tokyo Chemical Industry Co., Ltd.) | | Imidazole compound | 3.02 |
| C-5 | 5-Methylbenzimidazole (Tokyo Chemical Industry Co., Ltd.) | | Imidazole compound | 5.98 |
| C-6 | 1,2,3-Benzotriazole (Product name: BT-120, Johoku Chemical Co., Ltd) | | Triazole compound | 1.17 |

TABLE 1-continued

| | Compound name | Structural Formula | Classification | pKa of conjugate acid |
|---|---|---|---|---|
| C-7 | 1-[N,N-bis(2-ethylhexyl) aminomethyl]benzotriazole (Product name: BT-LX, Johoku Chemical Co., Ltd ) | | Triazole compound | 6.68 |
| C-8 | 3-Mercapto-1,2,4-triazole (Product name: 3MT, Otsuka Chemical Co., Ltd.) | | Triazole compound | 1.30 |
| C-9 | 3-Amino-5-methylthio-1H-1,2,4-triazole (Tokyo Chemical Industry Co., Ltd.) | | Triazole compound | 2.99 |
| C-10 | Carboxybenzotriazole (Product name: CBT-1, Johoku Chemical Co., Ltd.) | | Triazole compound | −0.06 |
| C-11 | 2,2'-[[(Methyl-1H-benzotriazol-1-yl)methyl]imino]bisethanol (Product name: TT-LYK, Johoku Chemical Co., Ltd.) | | Triazole compound | 5.51 |
| C-12 | 1-(2,3-Dicarboxypropyl) benzotriazole (Product name: BT-250, Johoku Chemical Co., Ltd) | | Triazole compound | 1.21 |
| C-13 | 1-[(2-Ethylhexylamino) methyl]benzotriazole (Product name: BT-260, Johoku Chemical Co., Ltd.) | | Triazole compound | 7.74 |

TABLE 1-continued

| | Compound name | Structural Formula | Classification | pKa of conjugate acid |
|---|---|---|---|---|
| C-14 | 2,6-Bis[(1H-benzotriazol-1-yl)methyl]-4-methylphenol (Product name: BT-3700, Johoku Chemical Co., Ltd.) | | Triazole compound | 1.49 |

TABLE 2

| | Compound name | Structural Formula | Classification | pKa of conjugate acid |
|---|---|---|---|---|
| C-15 | 1-(1',2'-Dicarboxyethyl) benzotriazole (Product name: BT-M, Johoku Chemical Co., Ltd.) | | Triazole compound | 0.09 |
| C-16 | 1,2,4-Triazole (Product name: 124T, Otsuka Chemical Co., Ltd.) | | Triazole compound | 2.70 |
| C-17 | 1,2,3-Triazole (Tokyo Chemical Industry Co., Ltd.) | | Triazole compound | 1.17 |
| C-18 | 5-Amino-1H-tetrazole (Product name: HAT, Toyobo Co., Ltd.) | | Tetrazole compound | 1.29 |
| C-19 | 1H-tetrazole (Product name: 1-HT, Toyobo Co., Ltd.) | | Tetrazole compound | −3.02 |
| C-20 | 1-Methyl-5-mercapto-tetrazole (Product name: MMT, Toyobo Co., Ltd.) | | Tetrazole compound | −2.98 |
| C-21 | 5-Mercapto-1-phenyl-1H-tetrazole (Product name: PMT, Toyobo Co., Ltd.) | | Tetrazole compound | −4.56 |
| C-22 | 5-Phenyl-1H-tetrazole (Product name: P5T, Toyobo Co., Ltd.) | | Tetrazole compound | −2.88 |

TABLE 2-continued

| | Compound name | Structural Formula | Classification | pKa of conjugate acid |
|---|---|---|---|---|
| C-23 | 2-Aminobenzothiazole (Tokyo Chemical Industry Co., Ltd.) | | Thiazole compound | 4.65 |
| C-24 | 1,3,4-Thiadiazole-2,5-dithiol (Product name: MTD, Toyobo Co., Ltd.) | | Thiadiazole compound | −2.11 |
| C-25 | 2-Mercapto-5-methylthio-1,3,4-thiadiazole (Tokyo Chemical Industry Co., Ltd.) | | Thiadiazole compound | −1.32 |
| C-26 | 2-Mercapto-1,3,4-thiadiazole (Tokyo Chemical Industry Co., Ltd.) | | Thiadiazole compound | −1.09 |
| C-27 | 2-Amino-5-methylthio-1,3,4-thiadiazole (Tokyo Chemical Industry Co., Ltd.) | | Thiadiazole compound | 2.12 |
| C-28 | 5-Amino-1,2,3-thiadiazole (Tokyo Chemical Industry Co., Ltd.) | | Thiadiazole compound | 0.34 |
| P-1 | Pyrazole (Tokyo Chemical Industry Co., Ltd.) | | Pyrazole compound | 2.57 |

(Preparation of Solution Having Concentration of Solid Contents of Polymer D of 36.3% by Mass)

In the preparation of materials A-1 to A-43, the material a-1, and the material a-2, as the binder, a solution having a concentration of solid contents of polymer D having the following structure of 36.3% by mass was used (solvent: propylene glycol monomethyl ether acetate). In the polymer D, a lower right numerical value of each structural unit represents a content ratio (% by mol) of each structural unit.

The solution having a concentration of solid contents of polymer D of 36.3% by mass was prepared by a polymerization step and an addition step shown below.

—Polymerization Step—

60 g of propylene glycol monomethyl ether acetate (manufactured by Sanwa Kagaku Sangyo Co., Ltd., product name: PGM-Ac) and 240 g of propylene glycol monomethyl ether (manufactured by Sanwa Kagaku Sangyo Co., Ltd., product name: PGM) were introduced to a flask of 2,000 mL. The obtained liquid was stirred at a stirring speed of 250 round per minute (rpm; the same applies hereinafter) and heated to 90° C.

In the preparation of the dropping solution (1), 107.1 g of methacrylic acid (manufactured by Mitsubishi Rayon Co., Ltd., product name: acryl ester M), 5.46 g of methyl methacrylate (manufactured by Mitsubishi Gas Chemical Company, product name: MMA), and 231.42 g of cyclohexyl methacrylate (manufactured by Mitsubishi Gas Chemical Company, product name: CHMA) were mixed with each other and diluted with 60 g of PGM-Ac, and accordingly, the dropping solution (1) was obtained.

In the preparation of the dropping solution (2), 9.637 g of dimethyl 2,2'-azobis (2-methyl propionate) (manufactured by Wako Pure Chemical Industries, Ltd., product name: V-601) and 136.56 g of PGM-Ac were dissolved, and accordingly, the dropping solution (2) was obtained.

The dropping solution (1) and the dropping solution (2) were added dropwise to the flask of 2,000 mL (specifically, flask of 2,000 mL including the liquid heated to 90° C.) for 3 minutes at the same time. Then, the container of the dropping solution (1) was washed with 12 g of PGM-Ac and a washing solution was added dropwise to the flask of 2,000 mL. Then, the container of the dropping solution (2) was washed with 6 g of PGM-Ac and the washing solution was added dropwise to the flask of 2,000 mL. During the dropwise addition, a reaction solution in the flask of 2,000 mL was maintained at 90° C. and stirred at a stirring speed of 250 rpm. In addition, as the postreaction, the reaction solution was stirred at 90° C. for 1 hour.

2.401 g of V-601 was added to the reaction solution after the postreaction, as the first additional addition of the initiator. In addition, the container of V-601 was washed with 6 g of PGM-Ac, and the washing solution was introduced to the reaction solution. After that, the reaction solution was stirred at 90° C. for 1 hour.

Next, 2.401 g of V-601 was added to the reaction solution as the second additional addition of the initiator. In addition, the container of V-601 was washed with 6 g of PGM-Ac, and the washing solution was introduced to the reaction solution. After that, the reaction solution was stirred at 90° C. for 1 hour.

Next, 2.401 g of V-601 was added to the reaction solution as the third additional addition of the initiator. In addition, the container of V-601 was washed with 6 g of PGM-Ac, and the washing solution was introduced to the reaction solution. After that, the reaction solution was stirred at 90° C. for 3 hours, —Addition Step—

After stirring at 90° C. for 3 hours, 178.66 g of PGM-Ac was introduced to the reaction solution. Next, 1.8 g of tetraethylammonium bromide (manufactured by Wako Pure Chemical Industries, Ltd.) and 0.8 g of hydroquinone monomethyl ether (manufactured by Wako Pure Chemical Industries, Ltd.) were added to the reaction solution. Each container was washed with 6 g of PGM-Ac, and the washing solution was introduced to the reaction solution. After that, the temperature of the reaction solution was increased to 100° C.

Next, 76.03 g of glycidyl methacrylate (manufactured by NOF CORPORATION, product name: BLEMMER G) was added dropwise to the reaction solution for 1 hour. The container of BLEMMER G was washed with 6 g of PGM-Ac, and the washing solution was introduced, to the reaction solution. After that, the reaction solution was stirred at 100° C. for 6 hours as an addition reaction.

Then, the reaction solution was cooled and filtered with a mesh filter (100 meshes) for collecting dust, and 1,158 g of a solution of the polymer D was obtained (concentration of solid contents of 36.3% by mass). Regarding the obtained polymer D, the weight-average molecular weight was 27,000, the number average molecular weight was 15,000, and the acid value was 95 mgKOH/g.

Polymer D

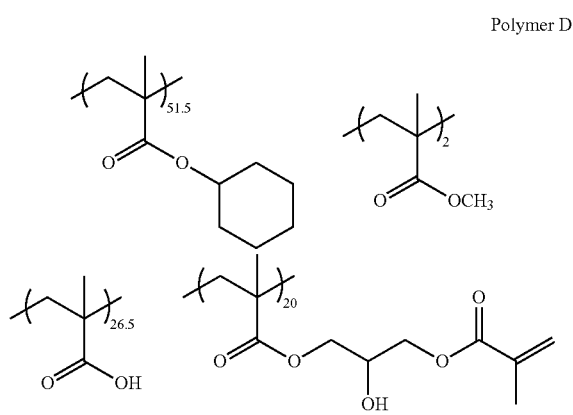

<Manufacturing of Photosensitive Layer Forming Transfer Film>

A coated film was obtained by applying a photosensitive layer forming composition (specifically, any one of materials A-1 to A-43, the material a-1, or the material a-2) onto a polyethylene terephthalate (PET) film having a thickness of 16 μm as the temporary support using a slit-shaped nozzle, and dried at a drying temperature of 100° C., and accordingly, a photosensitive layer was formed. Here, a coating amount of the photosensitive layer forming composition was adjusted so that a film thickness after drying becomes 8.0 μm.

Next, by pressing a protective film (polyethylene terephthalate (PET) film having a thickness of 12 μm) on the photosensitive layer formed on the temporary support, a photosensitive layer forming transfer film having a laminated structure of protective film/photosensitive layer/temporary support was obtained.

<Manufacturing of Colored Layer Forming Transfer Film>

A colored layer forming transfer film was manufactured by the method disclosed in paragraphs 0140 to 0146 of WO2016/088609A.

Specifically, a coated film was obtained by applying a thermoplastic resin layer forming composition having the following composition onto a polyethylene terephthalate (PET) film having a thickness of 75 μm as the temporary support using a slit-shaped nozzle, and dried at a drying temperature of 100° C., and accordingly, a thermoplastic resin layer was formed. Here, a coating amount of the thermoplastic resin layer forming composition was adjusted so that a film thickness after drying becomes 15.1 μm.

Next, a coated film was obtained by applying an interlayer forming composition having the following composition onto the surface of the formed thermoplastic resin layer using a slit-shaped nozzle, and dried at a drying temperature of 100° C., and accordingly, an interlayer was formed. Here, a coating amount of the interlayer forming composition was adjusted so that a film thickness after drying becomes 1.6 μm.

Next, a coated film was obtained by applying a colored layer forming composition having the following composition onto the surface of the formed interlayer using a slit-shaped nozzle, and dried at a drying temperature of 100° C., and accordingly, a colored layer was formed. Here, a coating amount of the colored layer forming composition was adjusted so that a film thickness after drying becomes 2.0 μm.

Next, by pressing a protective film (polypropylene film having a thickness of 12 μm) on the colored layer, a colored layer forming transfer film having a laminated structure of protective film/colored layer/interlayer/thermoplastic resin layer/temporary support was obtained.

(Preparation of Thermoplastic Resin Layer Forming Composition)

The components having the following composition were stirred and mixed, and the obtained mixed solution was filtered using a filter made of polytetrafluoroethylene (hole diameter: 0.3 μm), to prepare the thermoplastic resin layer forming composition.

—Composition of Thermoplastic Resin Layer Forming Composition—

Methanol: 11.10 parts by mass

Propylene glycol monomethyl ether acetate: 6.36 parts by mass

Methyl ethyl ketone: 52.40 parts by mass

Copolymer of methyl methacrylate/2-ethylhexyl acrylate/benzyl methacrylate/methacrylic acid (Copolymerization composition ratio (molar ratio): 55/11.7/4.5/28.8, weight-average molecular weight=100,000, Tg≈70° C.): 5.83 parts by mass Copolymer of styrene/acrylic acid (Copolymerization composition ratio (molar ratio): 63/37, weight-average molecular weight=10,000, Tg≈100° C.): 13.60 parts by mass 2,2-bis [4-(methacryloxypolyethoxy) phenyl] propane (Shin-Nakamura Chemical Co., Ltd.): 9.10 parts by mass Fluorine-based polymer (product name: MEGAFACE (registered trademark) F-780-F, DIC Corporation): 0.54 parts by mass (Preparation of Interlayer Forming Composition)

The components having the following composition were stirred and mixed, and the obtained mixed solution was filtered using a filter made of polytetrafluoroethylene (hole diameter: 0.3 μm), to prepare the interlayer forming composition.

—Composition of Interlayer Forming Composition—

Polyvinyl alcohol (product name: PVA205, saponification degree: 88%, polymerization degree: 550, manufactured by Kuraray Co., Ltd.): 32.20 parts by mass Polyvinyl pyrrolidone (product name: K-30, manufactured by ISP Japan): 14.90 parts by mass Distilled water: 524.00 parts by mass Methanol: 429.00 parts by mass (Preparation of Colored Layer Forming Composition)

The components having the following composition were stirred and mixed, and the obtained mixed solution was filtered using a filter made of polytetrafluoroethylene (hole diameter: 0.3 μm), to prepare the colored layer forming composition.

—Composition of Colored Layer Forming Composition—

Black pigment dispersion liquid shown below: 137.4 parts by mass

Dipentaerythritol (penta/hexa)acrylate (product name: KAYARAD (registered trademark) DPHA, manufactured by Nippon Kayaku Co., Ltd., polymerizable monomer): 19.5 parts by mass tricyclodecanedimethanol diacrylate (product name: A-DCP, manufactured by Shin-Nakamura Chemical Co., Ltd., polymerizable monomer): 6.5 parts by mass Glycidyl methacrylate adduct (d) of cyclohexyl methacrylate (a)/Methyl methacrylate (b)/methacrylic acid copolymer (c) copolymer [1-methoxy-2-propanol/methyl ethyl ketone solution having (Compositional ratio (% by mass): (a)/(b)/(c)/(d)/=46/1/10/43, weight-average molecular weight: 36.000, acid value of 66 mgKOH/g), amount of solid contents: 45% by mass, binder]: 81.2 parts by mass 1,2-octanedion,1-[4-(phenylthio)-,2-(O-benzoyloxime) (product name: IRGACURE (registered trademark) OXE-01, BASF Japan Ltd., polymerization initiator): 9.2 parts by mass Phenothiazine (polymerization inhibitor): 0.2 parts by mass Surfactant (product name: MEGAFACE (registered trademark) F-554, DIC Corporation): 0.4 parts by mass 1-Methoxy-2-propyl acetate: 236.7 parts by mass Methyl ethyl ketone: 321.3 parts by mass —Composition of Black Pigment Dispersion Liquid—

Resin-coated carbon black prepared by the following method: 13.10% by mass

Dispersing agent 1 having the following structure: 0.65% by mass

Polymer (benzyl methacrylate/methacrylic acid (=72/28 [molar ratio]), random copolymer, weight-average molecular weight of 37,000): 6.72% by mass Propylene glycol monomethyl ether acetate: 79.53% by mass

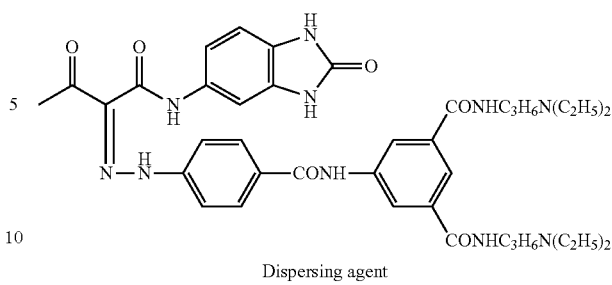

Dispersing agent (Preparation of Resin-Coated Carbon Black)

A resin-coated carbon black of Example 2 of JP5320652B was obtained by the method disclosed in paragraphs 0036 to 0042 of JP5320652B.

<Evaluation>

1. Discoloring of Copper

The protective film was peeled off from the photosensitive layer forming transfer film manufactured as described above, the photosensitive layer forming transfer film, from which the protective film was peeled off, was laminated on a PET film (substrate for a touch panel), on which copper foil manufactured by GEOMATEC Co., Ltd. was laminated, and accordingly, a photosensitive layer of the transfer film was transferred onto the surface of the copper foil, and a laminate having a laminated structure of temporary support/photosensitive layer/copper foil/substrate (PET film) was obtained.

The laminating conditions were set as conditions with a temperature of the substrate for a touch panel of 40° C., a rubber roller temperature (that is, laminating temperature) of 110° C., linear pressure of 3 N/cm, and a transportation speed of 2 m/min. Here, the copper foil is a film obtained by assuming the wiring for a touch panel.

Next, the photosensitive layer of the laminate was pattern-exposed through the temporary support using a proximity type exposure device including an ultrahigh pressure mercury lamp (manufactured by Hitachi High-Tech Electronics Engineering Co., Ltd.), by setting the distance between the surface of the exposure mask (quartz exposure mask including a pattern forming protective layer) and the surface of the temporary support as 125 μm, under the condition with exposure intensity of 100 mJ/cm² (i ray).

After the exposure, the temporary support was peeled off from the laminate.

Next, the photosensitive layer of the laminate, from which the temporary support was peeled off, was developed by using an aqueous solution having a concentration of sodium carbonate of 1% by mass (liquid temperature of 32° C.) as the developer for 40 seconds. After the development, moisture was removed by blowing air, a heating (post baking) process at 145° C. was performed for 60 minutes, and accordingly, a laminate for evaluation having a laminated, structure of protective layer/copper foil/substrate (PET film) including an opening was obtained. In the opening of the protective layer, the copper foil is exposed.

Regarding the laminate for evaluation obtained as described above, the surface of the copper foil exposed to the opening of the protective layer was observed using an optical microscope (magnification: 20 times), and the discoloring of copper was evaluated based on the following evaluation standard. The result is shown in Tables 3 to 8. In a case where the evaluation result is "1", "2", or "3", it is determined that the result is in the practically acceptable range.

(Evaluation Standard)

1: No discolored portion was observed at all.

2: Percentage of the discolored portion was equal to or smaller than 15% of the exposed surface of the copper foil.

3: Percentage of the discolored portion was greater than 15% and equal to or smaller than 50% of the exposed surface of the copper foil.

4: Percentage of the discolored portion was greater than 50% of the exposed surface of the copper foil.

2. Development Residue of Colored Layer

The protective film was peeled off from the photosensitive layer forming transfer film manufactured as described above, the photosensitive layer forming transfer film, from Which the protective film was peeled off, was laminated on a PET film (substrate for a touch panel), on which copper foil GEOMATEC Co., Ltd. was laminated, and accordingly, a photosensitive layer of the transfer film was transferred onto the surface of the copper foil, and a first laminate having a laminated structure of temporary support/photosensitive layer/copper foil/substrate (PET film) was obtained.

The laminating conditions were set as conditions with a temperature of the substrate for a touch panel of 40° C., a rubber roller temperature (that is, laminating temperature) of 110° C., linear pressure of 3 N/cm, and a transportation speed of 2 m/min. Here, the copper foil is a film obtained by assuming the wiring for a touch panel.

Next, the photosensitive layer of the first laminate was pattern-exposed through the temporary support using a proximity type exposure device including an ultrahigh pressure mercury lamp (manufactured by Hitachi High-Tech Electronics Engineering Co., Ltd.), by setting the distance between the surface of the exposure mask (quartz exposure mask including a pattern forming protective layer) and the surface of the temporary support as 125 µm, under the condition with exposure intensity of 100 mJ/cm$^2$ (i ray).

Then, the temporary support (that is, temporary support of the transfer film) was peeled off from the first laminate.

After the peeling, the photosensitive layer of the first laminate, from which the temporary support was peeled off, was developed by using an aqueous solution having a concentration of sodium carbonate of 2% by mass (liquid temperature of 32° C.) as the developer for 40 seconds, and a second laminate having a laminated structure of protective layer/copper film/substrate (PET film) including an opening was obtained. In the opening of the protective layer, a part of the copper film is exposed.

After the development, the protective film was peeled off from the colored layer forming transfer film manufactured as described above, the colored layer forming transfer film, from which the protective film was peeled off, was bonded and laminated so that the surface of the colored layer and the surface (copper foil surface of opening) of the copper foil exposed by removing the photosensitive layer due to the development, and accordingly, the colored layer of the colored layer forming transfer film was transferred, and a third laminate having a laminated structure of temporary support/thermoplastic resin layer/interlayer/colored layer/protective layer/copper foil/substrate (PET film) (here, the laminated structure of opening of the protective layer is temporary support/thermoplastic resin layer/interlayer/colored layer/copper foil/substrate (PET film)) was obtained.

The laminating was performed using a laminator (model name: Lamic II, Hitachi, Ltd.) under the conditions at a rubber roller temperature (that is, laminating temperature) of 130° C., linear pressure of 100 N/cm, and a transportation speed of 2.2 m/min.

Next, the temporary support (that is, temporary support of the colored layer forming transfer film) was peeled off from the third laminate.

After the peeling, the colored layer of the third laminate was exposed using a proximity type exposure device including an ultrahigh pressure mercury lamp (manufactured by Hitachi High-Tech Electronics Engineering Co., Ltd.), by setting the distance between the surface of the exposure mask and the surface of the thermoplastic resin layer as 125 µm, under the condition with exposure intensity of 100 mJ/cm$^2$ (i ray). The shower development was performed to an aqueous solution having a concentration of sodium carbonate of 1% by mass to form a colored pattern in region of a part on the protective layer. Next, washing with pure water was performed, the heating (post baking) was performed at a temperature of 145° C. in an oven for 30 minutes, and a laminate for evaluation which has a laminated structure of colored pattern/protective layer/copper foil/substrate (PET film) and in which copper foil is exposed to the opening of the protective layer was obtained.

Regarding the laminate for evaluation obtained as described above, the surface of the copper foil of the opening was observed using an optical microscope (magnification: 20 times), and the development residue of the colored layer was evaluated based on the following evaluation standard. The result is shown in Tables 3 to 8. In a case where the evaluation result is "1", "2", or "3", it is determined that the result is in the practically acceptable range.

(Evaluation Standard)

1: No development residue was observed at all.

2: Density of development residue on the surface of the copper foil was smaller than 3 piece/6 cm$^2$.

3: Density of development residue on the surface of the copper foil was equal to or greater than 3 piece/6 cm$^2$ and smaller than 5 piece/6 cm$^2$.

4: Density of development residue on the surface of the copper foil was equal to or greater than 5 piece/6 cm$^2$.

TABLE 3

| Component | | Material | pKa of conjugate acid | Example 1 Material A-1 | 2 Material A-2 | 3 Material A-3 | 4 Material A-4 | 5 Material A-5 | 6 Material A-6 | 7 Material A-7 | Comparative Example 1 Material a-1 | 2 Material a-2 |
|---|---|---|---|---|---|---|---|---|---|---|---|---|
| Photosensitive layer forming composition (% by mass) | Radical polymerizable monomer | A-DCP | | 5.84 | 5.31 | 5.31 | 3.98 | 5.31 | 5.31 | 5.31 | 5.31 | 5.31 |
| | | ARONIX (registered trademark) TO-2349 | | 1.22 | 1.11 | 1.11 | 1.11 | 1.11 | 1.11 | 1.11 | 1.11 | 1.11 |
| | | AD-TMP | | — | — | 5.31 | — | — | — | — | — | — |
| | | A-NOD-N | | — | — | — | 1.33 | — | — | — | — | — |
| | | 8UX-015A | | 2.92 | 2.65 | 2.65 | 2.65 | 2.65 | 2.65 | 2.65 | 2.65 | 2.65 |
| | | ARONIX (registered trademark) M-305 | | — | — | — | — | 2.65 | — | — | — | — |
| | Radical polymerization initiator | IRGACURE (registered trademark) OXE-02 | | 0.10 | 0.10 | 0.10 | 0.10 | 0.10 | — | — | 0.10 | 0.10 |
| | | IRGACURE (registered trademark) 907 | | 0.20 | 0.20 | 0.20 | 0.20 | 0.20 | 0.20 | 0.20 | 0.20 | 0.20 |
| | | IRGACURE (registered trademark) 379 EG | | — | — | — | — | — | 0.25 | — | — | — |
| | | IRGACURE (registered trademark) OXE-01 | | — | — | — | — | — | — | 0.10 | — | — |
| | | N-phenylglycine | | — | — | — | — | — | — | — | — | — |
| | Specific azole compound | Kind | | | | | | | | | | |
| | | Imidazole compound | C-1 | 5.67 | 0.15 | 0.15 | 0.15 | 0.15 | 0.15 | 0.15 | — | — |
| | | | C-2 | 8.15 | | | | | | | | |
| | | | C-3 | 2.38 | | | | | | | | |
| | | | C-4 | 3.02 | | | | | | | | |
| | | | C-5 | 5.98 | | | | | | | | |
| | | Triazole compound | C-6 | 1.17 | | | | | | | | |
| | | | C-7 | 6.68 | | | | | | | | |
| | | | C-8 | 1.30 | | | | | | | | |
| | | | C-9 | 2.99 | | | | | | | | |
| | | | C-10 | −0.06 | | | | | | | | |
| | | | C-11 | 5.51 | | | | | | | | |
| | | | C-12 | 1.21 | | | | | | | | |
| | | | C-13 | 7.74 | | | | | | | | |
| | | | C-14 | 1.49 | | | | | | | | |
| | | | C-15 | 0.09 | | | | | | | | |
| | | | C-16 | 2.70 | | | | | | | | |
| | | | C-17 | 1.17 | | | | | | | | |
| | | Tetrazole compound | C-18 | 1.29 | | | | | | | | |
| | | | C-19 | −3.02 | | | | | | | | |
| | | | C-20 | −2.98 | | | | | | | | |
| | | | C-21 | −4.56 | | | | | | | | |
| | | | C-22 | −2.88 | | | | | | | | |
| | | Thiazole compound | C-23 | 4.65 | | | | | | | | |
| | | Thiadiazole compound | C-24 | −2.11 | | | | | | | | |
| | | | C-25 | −1.32 | | | | | | | | |
| | | | C-26 | −1.09 | | | | | | | | |
| | | | C-27 | 2.12 | | | | | | | | |
| | | | C-28 | 0.34 | | | | | | | | |

TABLE 3-continued

| Component | | Material | 1 Material A-1 | 2 Material A-2 | 3 Material A-3 | 4 Material A-4 | 5 Material A-5 | 6 Material A-6 | 7 Material A-7 | Comparative Example 1 Material a-1 | Comparative Example 2 Material a-2 |
|---|---|---|---|---|---|---|---|---|---|---|---|
| Other azole compound | Pyrazole compound | P-1 | 2.57 | — | — | — | — | — | — | — | — |
| Binder | | Solution having concentration of solid contents of polymer D (acid value: 95 mgKOH/g) of 36.3% by mass | 50.77 | 43.28 | 43.28 | 43.28 | 43.28 | 42.87 | 43.28 | 43.87 | 43.46 |
| | | SMA EF-40P (Cray Valley) | — | — | — | — | — | — | — | — | — |
| Polymerization inhibitor | | Phenothiazine (Seiko Chemical Co., Ltd.) | — | — | — | — | — | — | — | — | — |
| Thermal crosslinking compound | | DURANATE (registered trademark) X3071.04 (Asahi Kasei Corporation) | — | 4.83 | — | 4.83 | 4.83 | 4.83 | 4.83 | 4.83 | 4.83 |
| | | DURANATE (registered trademark) TPA-B80E (Asahi Kasei Corporation) | — | — | 4.83 | — | — | — | — | — | — |
| Surfactant | | MEGAFACE (registered trademark) F-551 (DIC Corporation) | 0.15 | 0.15 | 0.15 | 0.15 | 0.15 | 0.15 | 0.15 | 0.15 | 0.15 |
| Solvent | | Methyl ethyl ketone | 38.66 | 42.22 | 42.22 | 42.22 | 42.22 | 42.48 | 42.22 | 41.78 | 42.05 |
| | | Solid content | 29.00 | 29.00 | 29.00 | 29.00 | 29.00 | 29.00 | 29.00 | 29.00 | 29.00 |
| Evaluation result | | Discoloring copper | 1 | 1 | 1 | 1 | 1 | 1 | 1 | 4 | 2 |
| | | Development residue of colored layer | 1 | 1 | 1 | 1 | 1 | 1 | 1 | 1 | 4 |

TABLE 4

| | | | | Example | | | | |
|---|---|---|---|---|---|---|---|---|
| | | | | 8 Material A-8 | 9 Material A-9 | 10 Material A-10 | 11 Material A-11 | 12 Material A-12 |
| Component | | Material | | | | | | |
| Photosensitive layer forming composition (% by mass) | Radical polymerizable monomer | A-DCP | | 5.31 | 5.31 | 5.31 | 5.31 | 5.31 |
| | | ARONIX (registered trademark) TO-2349 | | 1.11 | 1.11 | 1.11 | 1.11 | 1.11 |
| | | AD-TMP | | — | — | — | — | — |
| | | A-NOD-N | | — | — | — | — | — |
| | | 8UX-015A | | 2.65 | 2.65 | 2.65 | 2.65 | 2.65 |
| | | ARONIX (registered trademark) M-305 | | — | — | — | — | — |
| | Radical polymerization initiator | IRGACURE (registered trademark) OXE-02 | | 0.10 | 0.10 | 0.10 | 0.10 | 0.10 |
| | | IRGACURE (registered trademark) 907 | | 0.20 | 0.20 | 0.20 | 0.20 | 0.20 |
| | | IRGACURE (registered trademark) 379 EG | | — | — | — | — | — |
| | | IRGACURE (registered trademark) OXE-01 | | — | — | — | — | — |
| | | N-phenylglycine | | — | — | — | — | — |
| | Specific azole compound | Kind | pKa of conjugate acid | | | | | |
| | | Imidazole compound | C-1   5.67 | 0.15 | — | — | — | — |
| | | | C-2   8.15 | — | 0.15 | — | — | — |
| | | | C-3   2.38 | — | — | 0.15 | — | — |
| | | | C-4   3.02 | — | — | — | 0.15 | — |
| | | | C-5   5.98 | — | — | — | — | 0.15 |
| | | Triazole compound | C-6   1.17 | — | — | — | — | — |
| | | | C-7   6.68 | — | — | — | — | — |
| | | | C-8   1.30 | — | — | — | — | — |
| | | | C-9   2.99 | — | — | — | — | — |
| | | | C-10  −0.06 | — | — | — | — | — |
| | | | C-11  5.51 | — | — | — | — | — |
| | | | C-12  1.21 | — | — | — | — | — |
| | | | C-13  7.74 | — | — | — | — | — |
| | | | C-14  1.49 | — | — | — | — | — |
| | | | C-15  0.09 | — | — | — | — | — |
| | | | C-16  2.70 | — | — | — | — | — |
| | | | C-17  1.17 | — | — | — | — | — |
| | | Tetrazole compound | C-18  1.29 | — | — | — | — | — |
| | | | C-19  −3.02 | — | — | — | — | — |
| | | | C-20  −2.98 | — | — | — | — | — |
| | | | C-21  −4.56 | — | — | — | — | — |
| | | | C-22  −2.88 | — | — | — | — | — |
| | | Thiazole compound | C-23  4.65 | — | — | — | — | — |
| | | Thiadiazole compound | C-24  −2.11 | — | — | — | — | — |
| | | | C-25  −1.32 | — | — | — | — | — |
| | | | C-26  −1.09 | — | — | — | — | — |
| | | | C-27  2.12 | — | — | — | — | — |
| | | | C-28  0.34 | — | — | — | — | — |
| | Binder | Solution having concentration of solid contents of polymer D (acid value: 95 mgKOH/g) of 36.3% by mass | | 43.28 | 43.28 | 43.28 | 43.28 | 43.28 |
| | | SMA EF-40P (Cray Valley) | | — | — | — | — | — |
| | Polymerization inhibitor | Phenothiazine (Seiko Chemical Co., Ltd.) | | — | — | — | — | — |
| | Thermal crosslinking compound | DURANATE (registered trademark) X3071.04 (Asahi Kasei Corporation) | | 4.83 | 4.83 | 4.83 | 4.83 | 4.83 |
| | | DURANATE (registered trademark) TPA-B80E (Asahi Kasei Corporation) | | — | — | — | — | — |
| | Surfactant | MEGAFACE (registered trademark) F-551 (DIC Corporation) | | 0.15 | 0.15 | 0.15 | 0.15 | 0.15 |
| | Solvent | Methyl ethyl ketone | | 42.22 | 42.22 | 42.22 | 42.22 | 42.22 |
| | | Solid content | | 29.00 | 29.00 | 29.00 | 29.00 | 29.00 |
| Evaluation result | | Discoloring copper | | 2 | 2 | 2 | 2 | 2 |
| | | Development residue of colored layer | | 2 | 3 | 1 | 1 | 2 |

TABLE 5

| | | | Example | | | | | |
|---|---|---|---|---|---|---|---|---|
| Component | | Material | 13 | 14 | 15 | 16 | 17 | 16 |
| Photosensitive layer forming composition (% by mass) | Radical polymerizable monomer | A-DCP | 5.31 | 5.31 | 5.31 | 5.31 | 5.31 | 5.31 |
| | | ARONIX (registered trademark) TO-2349 | 1.11 | 1.11 | 1.11 | 1.11 | 1.11 | 1.11 |
| | | AD-TMP | — | — | — | — | — | — |
| | | A-NOD-N | — | — | — | — | — | — |
| | | 8UX-015A | 2.65 | 2.65 | 2.65 | 2.65 | 2.65 | 2.55 |
| | | ARONIX (registered trademark) M-305 | — | — | — | — | — | — |

TABLE 5-continued

| | | | | | | | | |
|---|---|---|---|---|---|---|---|---|
| | Radical poly-merization initiator | IRGACURE (registered trademark) OXE-02 | 0.10 | 0.10 | 0.10 | 0.10 | 0.10 | 0.10 |
| | | IRGACURE (registered trademark) 907 | 0.20 | 0.20 | 0.20 | 0.20 | 0.20 | 0.20 |
| | | IRGACURE (registered trademark) 379 EG | — | — | — | — | — | — |
| | | IRGACURE (registered trademark) OXE-01 | — | — | — | — | — | — |
| | | N-phenylglycine | | | | | | |
| Specific azole compound | Kind | | pKa of conjugate acid | | | | | |
| | Imidazole compound | C-1 | 5.67 | — | — | — | — | — | — |
| | | C-2 | 8.15 | — | — | — | — | — | — |
| | | C-3 | 2.38 | — | — | — | — | — | — |
| | | C-4 | 3.02 | — | — | — | — | — | — |
| | | C-5 | 5.98 | — | — | — | — | — | — |
| | Triazole compound | C-6 | 1.17 | 0.15 | — | — | — | — | — |
| | | C-7 | 6.68 | — | 0.15 | — | — | — | — |
| | | C-8 | 1.30 | — | — | 0.15 | — | — | — |
| | | C-9 | 2.99 | — | — | — | 0.15 | — | — |
| | | C-10 | −0.06 | — | — | — | — | 0.15 | — |
| | | C-11 | 5.51 | — | — | — | — | — | 0.15 |
| | | C-12 | 1.21 | — | — | — | — | — | — |
| | | C-13 | 7.74 | — | — | — | — | — | — |
| | | C-14 | 1.49 | — | — | — | — | — | — |
| | | C-15 | 0.09 | — | — | — | — | — | — |
| | | C-16 | 2.70 | — | — | — | — | — | — |
| | | C-17 | 1.17 | — | — | — | — | — | — |
| | Tetrazole compound | C-18 | 1.29 | — | — | — | — | — | — |
| | | C-19 | −3.02 | — | — | — | — | — | — |
| | | C-20 | −2.98 | — | — | — | — | — | — |
| | | C-21 | −4.56 | — | — | — | — | — | — |
| | | C-22 | −2.88 | — | — | — | — | — | — |
| | Thiazole compound | C-23 | 4.65 | — | — | — | — | — | — |
| | Thia-diazole compound | C-24 | −2.11 | — | — | — | — | — | — |
| | | C-25 | −1.32 | — | — | — | — | — | — |
| | | C-26 | −1.09 | — | — | — | — | — | — |
| | | C-27 | 2.12 | — | — | — | — | — | — |
| | | C-28 | 0.34 | — | — | — | — | — | — |
| | Binder | Solution having concentration of solid contents of polymer D (acid value: 95 mgKOH/g) of 36.3% by mass | 43.28 | 43.28 | 43.28 | 43.28 | 43.28 | 43.28 |
| | | SMA EF-40P (Cray Valley) | — | — | — | — | — | — |
| | Poly-merization inhibitor | Phenothiazine (Seiko Chemical Co., Ltd.) | — | — | — | — | — | — |
| | Thermal cross-linking compound | DURANATE (registered trademark) X3071.04 (Asahi Kasei Corporation) | 4.83 | 4.83 | 4.83 | 4.83 | 4.83 | 4.83 |
| | | DURANATE (registered trademark) TPA-B80E (Asahi Kasei Corporation) | — | — | — | — | — | — |
| | Surfactant | MEGAFACE (registered trademark) F-551 (DIC Corporation) | 0.15 | 0.15 | 0.15 | 0.15 | 0.15 | 0.15 |
| | Solvent | Methyl ethyl ketone | 42.22 | 42.22 | 42.22 | 42.22 | 42.22 | 42.22 |
| | | Solid content | 29.00 | 29.00 | 29.00 | 29.00 | 29.00 | 29.00 |
| Evaluation result | | Discoloring copper | 1 | 2 | 2 | 2 | 2 | 2 |
| | | Development residue of colored layer | 1 | 3 | 1 | 1 | 1 | 2 |

| | | | Example | | | | | |
|---|---|---|---|---|---|---|---|---|
| Component | | Material | 19 | 20 | 21 | 22 | 23 | 24 |
| Photo-sensitive layer forming composition (% by mass) | Radical poly-merizable monomer | A-DCP | 5.31 | 5.31 | 5.31 | 5.31 | 5.31 | 5.31 |
| | | ARONIX (registered trademark) TO-2349 | 1.11 | 1.11 | 1.11 | 1.11 | 1.11 | 1.11 |
| | | AD-TMP | — | — | — | — | — | — |
| | | A-NOD-N | — | — | — | — | — | — |
| | | 8UX-015A | 2.65 | 2.65 | 2.65 | 2.65 | 2.65 | 2.65 |
| | | ARONIX (registered trademark) M-305 | — | — | — | — | — | — |
| | Radical poly-merization initiator | IRGACURE (registered trademark) OXE-02 | 0.10 | 0.10 | 0.10 | 0.10 | 0.10 | 0.10 |
| | | IRGACURE (registered trademark) 907 | 0.20 | 0.20 | 0.20 | 0.20 | 0.20 | 0.20 |

TABLE 5-continued

|  |  |  |  |  |  |  |  |  |
|---|---|---|---|---|---|---|---|---|
|  | IRGACURE (registered trademark) 379 EG | | — | — | — | — | — | — |
|  | IRGACURE (registered trademark) OXE-01 | | — | — | — | — | — | — |
|  | N-phenylglycine | | | | | | | |
| Specific azole compound | Kind | pKa of conjugate acid | | | | | | |
|  | Imidazole compound | C-1 | 5.67 | — | — | — | — | — | — |
|  |  | C-2 | 8.15 | — | — | — | — | — | — |
|  |  | C-3 | 2.38 | — | — | — | — | — | — |
|  |  | C-4 | 3.02 | — | — | — | — | — | — |
|  |  | C-5 | 5.98 | — | — | — | — | — | — |
|  | Triazole compound | C-6 | 1.17 | — | — | — | — | — | — |
|  |  | C-7 | 6.68 | — | — | — | — | — | — |
|  |  | C-8 | 1.30 | — | — | — | — | — | — |
|  |  | C-9 | 2.99 | — | — | — | — | — | — |
|  |  | C-10 | −0.06 | — | — | — | — | — | — |
|  |  | C-11 | 5.51 | — | — | — | — | — | — |
|  |  | C-12 | 1.21 | 0.15 | — | — | — | — | — |
|  |  | C-13 | 7.74 | — | 0.15 | — | — | — | — |
|  |  | C-14 | 1.49 | — | — | 0.15 | — | — | — |
|  |  | C-15 | 0.09 | — | — | — | 0.15 | — | — |
|  |  | C-16 | 2.70 | — | — | — | — | 0.15 | — |
|  |  | C-17 | 1.17 | — | — | — | — | — | 0.15 |
|  | Tetrazole compound | C-18 | 1.29 | — | — | — | — | — | — |
|  |  | C-19 | −3.02 | — | — | — | — | — | — |
|  |  | C-20 | −2.98 | — | — | — | — | — | — |
|  |  | C-21 | −4.56 | — | — | — | — | — | — |
|  |  | C-22 | −2.88 | — | — | — | — | — | — |
|  | Thiazole compound | C-23 | 4.65 | — | — | — | — | — | — |
|  | Thia-diazole compound | C-24 | −2.11 | — | — | — | — | — | — |
|  |  | C-25 | −1.32 | — | — | — | — | — | — |
|  |  | C-26 | −1.09 | — | — | — | — | — | — |
|  |  | C-27 | 2.12 | — | — | — | — | — | — |
|  |  | C-28 | 0.34 | — | — | — | — | — | — |
| Binder | Solution having concentration of solid contents of polymer D (acid value: 95 mgKOH/g) of 36.3% by mass | | 43.28 | 43.28 | 43.28 | 43.28 | 43.46 | 43.46 |
|  | SMA EF-40P (Cray Valley) | | — | — | — | — | — | — |
| Poly-merization inhibitor | Phenothiazine (Seiko Chemical Co., Ltd.) | | — | — | — | — | — | — |
| Thermal cross-linking compound | DURANATE (registered trademark) X3071.04 (Asahi Kasei Corporation) | | 4.83 | 4.83 | 4.83 | 4.83 | 4.83 | 4.83 |
|  | DURANATE (registered trademark) TPA-B80E (Asahi Kasei Corporation) | | — | — | — | — | — | — |
| Surfactant | MEGAFACE (registered trademark) F-551 (DIC Corporation) | | 0.15 | 0.15 | 0.15 | 0.15 | 0.15 | 0.15 |
| Solvent | Methyl ethyl ketone | | 42.22 | 42.22 | 42.22 | 42.22 | 42.05 | 42.05 |
|  | Solid content | | 29.00 | 29.00 | 29.00 | 29.00 | 29.00 | 29.00 |
| Evaluation result | Discoloring copper | | 2 | 2 | 2 | 2 | 1 | 2 |
|  | Development residue of colored layer | | 1 | 3 | 1 | 1 | 1 | 1 |

TABLE 6

| Component | | Material | pKa of conjugate acid | Example 25 Material A-25 | 26 Material A-26 | 27 Material A-27 | 28 Material A-28 | 29 Material A-29 | 30 Material A-30 | 31 Material A-31 | 32 Material A-32 | 33 Material A-33 | 34 Material A-34 |
|---|---|---|---|---|---|---|---|---|---|---|---|---|---|
| Photosensitive layer forming composition (% by mass) | Radical polymerizable monomer | A-DCP | | 5.31 | 5.31 | 5.31 | 5.31 | 5.31 | 5.31 | 5.31 | 5.31 | 5.31 | 5.31 |
| | | ARONIX (registered trademark) TO-2349 | | 1.11 | 1.11 | 1.11 | 1.11 | 1.11 | 1.11 | 1.11 | 1.11 | 1.11 | 1.11 |
| | | AD-TMP | | — | — | — | — | — | — | — | — | — | — |
| | | A-NOD-N | | — | — | — | — | — | — | — | — | — | — |
| | | 8UX-015A | | — | — | — | — | — | — | — | — | — | — |
| | | ARONIX (registered trademark) M-305 | | 2.65 | 2.65 | 2.65 | 2.65 | 2.65 | 2.65 | 2.65 | 2.65 | 2.65 | 2.65 |
| | Radical polymerization initiator | IRGACURE (registered trademark) OXE-02 | | 0.10 | 0.10 | 0.10 | 0.10 | 0.10 | 0.10 | 0.10 | 0.10 | 0.10 | 0.10 |
| | | IRGACURE (registered trademark) 907 | | 0.20 | 0.20 | 0.20 | 0.20 | 0.20 | 0.20 | 0.20 | 0.20 | 0.20 | 0.20 |
| | | IRGACURE (registered trademark) 379 EG | | — | — | — | — | — | — | — | — | — | — |
| | | IRGACURE (registered trademark) OXE-01 | | — | — | — | — | — | — | — | — | — | — |
| | Specific azole compound | N-phenylglycine | | — | — | — | — | — | — | — | — | — | — |
| | | Kind | | | | | | | | | | | |
| | | Imidazole compound C-1 | 5.67 | — | — | — | — | — | — | — | — | — | — |
| | | C-2 | 8.15 | — | — | — | — | — | — | — | — | — | — |
| | | C-3 | 2.38 | — | — | — | — | — | — | — | — | — | — |
| | | C-4 | 3.02 | — | — | — | — | — | — | — | — | — | — |
| | | C-5 | 5.98 | — | — | — | — | — | — | — | — | — | — |
| | | Triazole compound C-6 | 1.17 | — | — | — | — | — | — | — | — | — | — |
| | | C-7 | 6.68 | — | — | — | — | — | — | — | — | — | — |
| | | C-8 | 1.30 | — | — | — | — | — | — | — | — | — | — |
| | | C-9 | 2.99 | — | — | — | — | — | — | — | — | — | — |
| | | C-10 | −0.06 | — | — | — | — | — | — | — | — | — | — |
| | | C-11 | 5.51 | — | — | — | — | — | — | — | — | — | — |
| | | C-12 | 1.21 | — | — | — | — | — | — | — | — | — | — |
| | | C-13 | 7.74 | — | — | — | — | — | — | — | — | — | — |
| | | C-14 | 1.49 | — | — | — | — | — | — | — | — | — | — |
| | | C-15 | 0.09 | — | — | — | — | — | — | — | — | — | — |
| | | C-16 | 2.70 | — | — | — | — | — | — | — | — | — | — |
| | | C-17 | 1.17 | — | — | — | — | — | — | — | — | — | — |
| | | Tetrazole compound C-18 | 1.29 | 0.15 | — | — | — | — | — | — | — | — | — |
| | | C-19 | −3.02 | — | 0.15 | — | — | — | — | — | — | — | — |
| | | C-20 | −2.98 | — | — | 0.15 | — | — | — | — | — | — | — |
| | | C-21 | −4.56 | — | — | — | 0.15 | — | — | — | — | — | — |
| | | C-22 | −2.88 | — | — | — | — | 0.15 | — | — | — | — | — |
| | | Thiazole C-23 | 4.65 | — | — | — | — | — | 0.15 | — | — | — | — |
| | | Thiadiazole compound C-24 | −2.11 | — | — | — | — | — | — | 0.15 | — | — | — |
| | | C-25 | −1.32 | — | — | — | — | — | — | — | 0.15 | — | — |
| | | C-26 | −1.09 | — | — | — | — | — | — | — | — | 0.15 | — |
| | | C-27 | 2.12 | — | — | — | — | — | — | — | — | — | 0.15 |
| | | C-28 | 0.34 | — | — | — | — | — | — | — | — | — | — |

TABLE 6-continued

| Component | | Material | Example |  |  |  |  |  |  |  |  |  |
| --- | --- | --- | --- | --- | --- | --- | --- | --- | --- | --- | --- | --- |
| | | | 25 Material A-25 | 26 Material A-26 | 27 Material A-27 | 28 Material A-28 | 29 Material A-29 | 30 Material A-30 | 31 Material A-31 | 32 Material A-32 | 33 Material A-33 | 34 Material A-34 |
| Binder | | Solution having concentration of solid contents of polymer D (acid value: 95 mgKOH/g) of 36.3% by mass | 43.28 | 43.28 | 43.28 | 43.28 | 43.28 | 43.28 | 43.28 | 43.28 | 43.28 | 43.28 |
| | | SMA EF-40P (Cray Valley) | — | — | — | — | — | — | — | — | — | — |
| Polymerization inhibitor | | Phenothiazine (Seiko Chemical Co., Ltd.) | — | — | — | — | — | — | — | — | — | — |
| Thermal crosslinking compound | | DURANATE (registered trademark) X3071.04 (Asahi Kasei Corporation) | 4.83 | 4.83 | 4.83 | 4.83 | 4.83 | 4.83 | 4.83 | 4.83 | 4.83 | 4.83 |
| | | DURANATE (registered trademark) TPA-B80E (Asahi Kasei Corporation) | — | — | — | — | — | — | — | — | — | — |
| Surfactant | | MEGAFACE (registered trademark) F-551 (DIC Corporation) | 0.15 | 0.15 | 0.15 | 0.15 | 0.15 | 0.15 | 0.15 | 0.15 | 0.15 | 0.15 |
| Solvent | | Methyl ethyl ketone | 42.22 | 42.22 | 42.22 | 42.22 | 42.22 | 42.22 | 42.22 | 42.22 | 42.22 | 42.22 |
| | | Solid content | 29.00 | 29.00 | 29.00 | 29.00 | 29.00 | 29.00 | 29.00 | 29.00 | 29.00 | 29.00 |
| Evaluation result | | Discoloring copper | 2 | 2 | 2 | 2 | 3 | 3 | 3 | 3 | 3 | 3 |
| | | Development residue of colored layer | 1 | 1 | 1 | 1 | 2 | 1 | 1 | 1 | 1 | 1 |

TABLE 7

| Component | | Material | pKa of conjugate | Example 35 Material A-35 | 36 Material A-36 | 37 Material A-37 | 38 Material A-38 | 39 Material A-39 | 40 Material A-40 |
|---|---|---|---|---|---|---|---|---|---|
| Photosensitive layer forming composition (% by mass) | Radical polymerizable monomer | A-DCP | | 5.31 | 5.31 | 5.31 | 5.31 | 5.31 | 5.31 |
| | | ARONIX (registered trademark) TO-2349 | | 1.11 | 1.11 | 1.11 | 1.11 | 1.11 | 1.11 |
| | | AD-TMP | | — | — | — | — | — | — |
| | | A-NOD-N | | — | — | — | — | — | — |
| | | 8UX-015A | | 2.65 | 2.65 | 2.65 | 2.65 | 2.65 | 2.65 |
| | | ARONIX (registered trademark) M-305 | | — | — | — | — | — | — |
| | Radical polymerization initiator | IRGACURE (registered trademark) OXE-02 | | 0.10 | 0.10 | 0.10 | 0.10 | 0.10 | 0.10 |
| | | IRGACURE (registered trademark) 907 | | 0.20 | 0.20 | 0.20 | 0.20 | 0.20 | 0.20 |
| | | IRGACURE (registered trademark) 379 EG | | — | — | — | — | — | — |
| | | IRGACURE (registered trademark) OXE-01 | | — | — | — | — | — | — |
| | | N-phenylglycine | | — | — | — | — | — | — |
| | Specific azole compound | Kind | | | | | | | |
| | | Imidazole compound C-1 | 5.67 | — | — | — | — | — | — |
| | | C-2 | 8.15 | — | — | — | — | — | — |
| | | C-3 | 2.38 | — | — | — | — | — | — |
| | | C-4 | 3.02 | — | — | — | — | — | — |
| | | C-5 | 5.98 | — | — | — | — | — | — |
| | | Triazole compound C-6 | 1.17 | — | — | — | — | — | — |
| | | C-7 | 6.68 | — | — | — | — | — | — |
| | | C-8 | 1.30 | — | — | — | — | — | — |
| | | C-9 | 2.99 | — | — | — | — | — | — |
| | | C-10 | −0.06 | — | — | — | — | — | — |
| | | C-11 | 5.51 | — | — | — | — | — | — |
| | | C-12 | 1.21 | — | — | — | — | — | — |
| | | C-13 | 7.74 | — | — | — | — | — | — |
| | | C-14 | 1.49 | — | — | — | — | — | — |
| | | C-15 | 0.09 | — | — | — | — | — | — |
| | | C-16 | 2.70 | — | — | — | — | — | — |
| | | C-17 | 1.17 | — | — | — | — | — | — |
| | | Tetrazole compound C-18 | 1.29 | 0.03 | 0.06 | 0.09 | 0.87 | 1.45 | 2.90 |
| | | C-19 | −3.02 | — | — | — | — | — | — |
| | | C-20 | −2.98 | — | — | — | — | — | — |
| | | C-21 | −4.56 | — | — | — | — | — | — |
| | | C-22 | −2.88 | — | — | — | — | — | — |
| | | Thiazole compound C-23 | 4.65 | — | — | — | — | — | — |
| | | Thiadiazole compound C-24 | −2.11 | — | — | — | — | — | — |
| | | C-25 | −1.32 | — | — | — | — | — | — |
| | | C-26 | −1.09 | — | — | — | — | — | — |
| | | C-27 | 2.12 | — | — | — | — | — | — |
| | | C-28 | 0.34 | — | — | — | — | — | — |

TABLE 7-continued

| | | Example | | | | | |
|---|---|---|---|---|---|---|---|
| Component | Material | 35 Material A-35 | 36 Material A-36 | 37 Material A-37 | 38 Material A-38 | 39 Material A-39 | 40 Material A-40 |
| Binder | Solution having concentration of solid contents of polymer D (acid value: 95 mgKOH/g) of 36.3% by mass | 43.61 | 43.53 | 43.45 | 41.30 | 39.70 | 35.71 |
| | SMA EF-40P (Cray Valley) | — | — | — | — | — | — |
| Polymerization inhibitor | Phenothiazine (Seiko Chemical Co., Ltd.) | — | — | — | — | — | — |
| Thermal crosslinking compound | DURANATE (registered trademark) X3071.04 (Asahi Kasei Corporation) | 4.83 | 4.83 | 4.83 | 4.83 | 4.83 | 4.83 |
| | DURANATE (registered trademark) TPA-B80E (Asahi Kasei Corporation) | — | — | — | — | — | — |
| Surfactant | MEGAFACE (registered trademark) F-551 (DIC Corporation) | 0.15 | 0.15 | 0.15 | 0.15 | 0.15 | 0.15 |
| Solvent | Methyl ethyl ketone | 42.01 | 42.06 | 42.11 | 43.48 | 44.50 | 47.05 |
| | Solid content | 29.00 | 29.00 | 29.00 | 29.00 | 29.00 | 29.00 |
| Evaluation result | Discoloring copper | 3 | 2 | 1 | 1 | 1 | 1 |
| | Development residue of colored layer | 1 | 1 | 1 | 1 | 2 | 3 |

TABLE 8

|  |  |  |  | Example 41 Material A-41 | Example 42 Material A-42 | Example 43 Material A-43 |
|---|---|---|---|---|---|---|
| Component | | Material | | | | |
| Photosensitive layer forming composition (% by mass) | Radical polymerizable monomer | A-DCP | | 5.31 | 5.31 | 4.67 |
| | | ARONIX (registered trademark) TO-2349 | | 1.11 | 1.11 | 2.18 |
| | | AD-TMP | | — | — | — |
| | | A-NOD-N | | — | — | — |
| | | 8UX-015A | | 2.65 | 2.65 | 1.62 |
| | | ARONIX (registered trademark) M-305 | | — | — | 0.70 |
| | Radical polymerization initiator | IRGACURE (registered trademark) OXE-02 | | 0.10 | 0.10 | 0.10 |
| | | IRGACURE (registered trademark) 907 | | 0.20 | 0.20 | 0.20 |
| | | IRGACURE (registered trademark) 379 EG | | — | — | — |
| | | IRGACURE (registered trademark) OXE-01 | | — | — | — |
| | | N-phenylglycine | | 0.06 | 0.06 | 0.15 |
| | Specific azole compound | Kind | pKa of conjugate acid | | | |
| | | Imidazole compound  C-1 | 5.67 | 0.15 | — | — |
| | | C-2 | 8.15 | — | — | — |
| | | C-3 | 2.38 | — | — | — |
| | | C-4 | 3.02 | — | — | — |
| | | C-5 | 5.98 | — | — | — |
| | | Triazole compound  C-6 | 1.17 | — | — | — |
| | | C-7 | 6.68 | — | — | — |
| | | C-8 | 1.30 | — | — | — |
| | | C-9 | 2.99 | — | — | — |
| | | C-10 | −0.06 | — | — | — |
| | | C-11 | 5.51 | — | — | — |
| | | C-12 | 1.21 | — | — | — |
| | | C-13 | 7.74 | — | — | — |
| | | C-14 | 1.49 | — | — | — |
| | | C-15 | 0.09 | — | — | — |
| | | C-16 | 2.70 | — | — | 0.15 |
| | | C-17 | 1.17 | — | — | — |
| | | Tetrazole compound  C-18 | 1.29 | — | 0.15 | — |
| | | C-19 | −3.02 | — | — | — |
| | | C-20 | −2.98 | — | — | — |
| | | C-21 | −4.56 | — | — | — |
| | | C-22 | −2.88 | — | — | — |
| | | Thiazole compound  C-23 | 4.65 | — | — | — |
| | | Thiadiazole compound  C-24 | −2.11 | — | — | — |
| | | C-25 | −1.32 | — | — | — |
| | | C-26 | −1.09 | — | — | — |
| | | C-27 | 2.12 | — | — | — |
| | | C-28 | 0.34 | — | — | — |
| | Binder | Solution having concentration of solid contents of polymer D (acid value: 95 mgKOH/g) of 36.3% by mass | | 43.09 | 43.09 | 42.56 |
| | | SMA EF-40P (Cray Valley) | | — | — | 1.45 |
| | Polymerization inhibitor | Phenothiazine (Seiko Chemical Co., Ltd.) | | 0.01 | 0.01 | 0.01 |
| | Thermal crosslinking compound | DURANATE (registered trademark) X3071.04 (Asahi Kasei Corporation) | | 4.83 | — | 4.83 |
| | | DURANATE (registered trademark) TPA-B80E (Asahi Kasei Corporation) | | — | 4.83 | — |
| | Surfactant | MEGAFACE (registered trademark) F-551 (DIC Corporation) | | 0.15 | 0.15 | 0.15 |
| | Solvent | Methyl ethyl ketone | | 42.34 | 42.34 | 41.23 |
| | | Solid content | | 29.00 | 29.00 | 29.00 |
| Evaluation result | | Discoloring copper | | 2 | 1 | 2 |
| | | Development residue of colored layer | | 2 | 1 | 1 |

The numerical values shown in the column of each component in Tables 3 to 8 indicates a content (unit: % by mass) of the component and "—" means that the component is not included.

Details of each component shown in Tables 3 to 8 are as shown below.

<Radical Polymerizable Monomer>

A-DCP: Tricyclodecane dimethanol diacrylate (Shin-Nakamura Chemical Co.; Ltd.; difunctional monomer)

ARONIX (registered trademark) TO-2349: carboxyl group-containing monomer (Toagosei Co., Ltd.; mixture of pentafunctional monomer and hexafunctional monomer)

AD-TMP: ditrimethylolpropane tetraacrylate (Shin-Nakamura Chemical Co., Ltd.; tetrafunctional monomer)

A-NOD-N: 1,9-nonanediol diacrylate (manufactured by Shin-Nakamura Chemical Co., Ltd.; difunctional monomer)

8UX-015A: urethane acrylate (manufactured by Taisei Fine Chemical Co., Ltd.; 15-functional monomer)

ARONIX (registered trademark) M-305: pentaerythritol triacrylate (manufactured by Toagosei Co., Ltd.; trifunctional monomer)

<Radical Polymerization Initiator>

IRGACURE (registered trademark) OXE-02: Ethanone, 1-[9-ethyl-6-(2-methylbenzoyl)-9H-carbazole-3-yl]-, 1-(O-acetyloxime) (BASF Japan Ltd.; oxime-based photopolymerization initiator)

IRGACURE (registered trademark) 907: 2-methyl-1-(4-methylthiophenyl)-2-morpholinopropan-1-one (BASF Japan Ltd.; α-aminoalkylphenone-based photopolymerization initiator)

IRGACURE (registered trademark) 379 EG: 2-(dimethylamino)-2-[(4-methylphenyl) methyl]-1-[4-(4-morpholinyl) phenyl]-1-butanone (BASF Japan Ltd; α-aminoalkylphenone-based photopolymerization initiator)

IRGACURE (registered trademark) OXE-01: 1,2-octanedione, 1-[4-(phenylthio)-, 2-(O-benzoyloxime)] (BASF Japan Ltd.; oxime-based photopolymerization initiator)

N-phenylglycine: photopolymerization initiator manufactured by Junsei Chemical Co., Ltd.

<Binder>

SMA EF-40P (Cray Valley)

All of the thermal crosslinking compounds in Tables 3 to 8 (DURANATE (registered trademark) X3071.04 and DURANATE (registered trademark) TPA-B80E) are hexamethylene diisocyanate-based blocked isocyanate compounds.

As shown in Tables 3 to 8, in Examples 1 to 43 in which the photosensitive layer includes the specific azole compound, the discoloring of copper and the generation of the development residue of the colored layer could be prevented.

On the other hand, as shown in Table 3, in Comparative Example 1 in which the photosensitive layer does not include the specific azole compound and Comparative Example 2 in which the photosensitive layer includes an azole compound other than the specific azole compound, the discoloring of copper and the development residue of the colored layer were significantly confirmed, and the prevention of the discoloring of copper and the prevention of the generation of the development residue of the colored layer could not be satisfied.

In Examples 1 to 7, 10, 11, 13, 15 to 17, 19, 21 to 28, 30 to 38, 42, and 43 in which the content of the specific azole compound having pKa of conjugate acid equal to or smaller than 4.00 is 0.1% by mass to 3% by mass with respect to the amount of solid contents of the photosensitive layer forming composition, the generation of the development residue of the colored layer could be further prevented, compared to examples in which the specific azole compound having pKa of conjugate acid exceeding 4.00 is included.

Examples 101 to 143, Comparative Example 101, and Comparative Example 102

In Examples 101 to 143, Comparative Example 101, and Comparative Example 102, the same operation was performed as each operation of Examples 1 to 43, Comparative Example 1, and Comparative Example 2, except that the photosensitive layer forming transfer film having a laminated structure of protective film/photosensitive layer/temporary support was changed to the transfer film having a laminated structure of protective film/refractive index adjusting layer/photosensitive layer/temporary support, and the evaluation test regarding the discoloring of copper and the development residue of the colored layer was performed.

In Examples 101 to 143, Comparative Example 101, and Comparative Example 102, a material B-1 having the composition shown in Table 9 was used as the material of the refractive index adjusting layer.

In Examples 101 to 143, Comparative Example 101, and Comparative Example 102, the transfer film having a laminated structure of protective film/refractive index adjusting layer/photosensitive layer/temporary support was manufactured as follows.

A coated film was obtained by applying a photosensitive layer forming composition (specifically, any one of materials A-1 to A-43, material a-1, or material a-2) onto a polyethylene terephthalate (PET) film having a thickness of 16 μm as the temporary support using a slit-shaped nozzle. The obtained coated film was dried at a drying temperature of 100° C., and accordingly, a photosensitive layer was formed. Here, a coating amount of the photosensitive layer forming composition was adjusted so that a film thickness after drying becomes 8.0 μm.

Next, a coated film was obtained by applying the material B-1 which is a composition for forming the refractive index adjusting layer on the photosensitive layer using a slit-shaped nozzle. The obtained coated film was dried at a drying temperature of 100° C., and accordingly, a refractive index adjusting layer was formed. Here, a coating amount of the material B-1 was adjusted so that a film thickness after drying (film thickness of refractive index adjusting layer) becomes approximately 80 nm. The refractive index of the formed refractive index adjusting layer was 1.68.

Then, by pressing a protective film (polypropylene film having a thickness of 12 μm) on the refractive index adjusting layer, a transfer film having a laminated structure of protective film/refractive index adjusting layer/photosensitive layer/temporary support was obtained.

In Examples 101 to 143, Comparative Example 101, and Comparative Example 102, the laminating of the transfer film was performed by peeling off the protective film from the transfer film to expose the refractive index adjusting layer and using the transfer film from which the refractive index adjusting layer was exposed.

The result of the evaluation test is shown in Table 10.

Example 144

In Example 144, the operation same as that in Example 102 was performed, except that the material B-1 which is the composition for forming the refractive index adjusting layer was changed to the material B-2 having a composition shown in Table 9.

The result of the evaluation test is shown in Table 10.

TABLE 9

| Material | Material B-1 | Material B-2 |
|---|---|---|
| NANOUSE (registered trademark) OZ-S30M (ZrO₃ particles methanol dispersion liquid, non-volatilized amount 30.5% by mass) [Nissan Chemical Industries, Ltd.] | 4.36 | — |
| Ammonia water (2.5% by mass) | 0.24 | 0.24 |
| Copolymer resin of methacrylic acid/allyl methacrylate (weight-average molecular weight: 25,000, compositional ratio = 20/80 (mol %)) | 5.28 | 14.17 |
| ARUFON (registered trademark) UC-3920 [Toagosei Co., Ltd.] | 0.05 | 0.05 |
| ARONEX (registered trademark) TO-2349 [Carboxylic acid-containing monomer, Toagosei Co., Ltd.] | 0.03 | 0.50 |
| MEGAFACE (registered trademark) F-444 [DIC Corporation] | 0.01 | 0.01 |
| Ion exchange water | 25.03 | 25.03 |
| Methanol | 65.00 | 60.00 |
| Total (parts by mass) | 100.00 | 100.00 |

TABLE 10

| | Material of transfer film | | Evaluation result | |
|---|---|---|---|---|
| | Photosensitive layer | Refractive index adjusting layer | Discoloring of copper | Development residue of colored layer |
| Example 101 | Material A-1 | Material B-1 | 1 | 1 |
| Example 102 | Material A-2 | Material B-1 | 1 | 1 |
| Example 103 | Material A-3 | Material B-1 | 1 | 1 |
| Example 104 | Material A-4 | Material B-1 | 1 | 1 |
| Example 105 | Material A-5 | Material B-1 | 1 | 1 |
| Example 106 | Material A-6 | Material B-1 | 1 | 1 |
| Example 107 | Material A-7 | Material B-1 | 1 | 1 |
| Example 108 | Material A-8 | Material B-1 | 2 | 2 |
| Example 109 | Material A-9 | Material B-1 | 2 | 3 |
| Example 110 | Material A-10 | Material B-1 | 2 | 1 |
| Example 111 | Material A-11 | Material B-1 | 2 | 1 |
| Example 112 | Material A-12 | Material B-1 | 2 | 2 |
| Example 113 | Material A-13 | Material B-1 | 1 | 1 |
| Example 114 | Material A-14 | Material B-1 | 2 | 3 |
| Example 115 | Material A-15 | Material B-1 | 2 | 1 |
| Example 116 | Material A-16 | Material B-1 | 1 | 1 |
| Example 117 | Material A-17 | Material B-1 | 1 | 1 |
| Example 118 | Material A-18 | Material B-1 | 2 | 1 |
| Example 119 | Material A-19 | Material B-1 | 2 | 1 |
| Example 120 | Material A-20 | Material B-1 | 2 | 2 |
| Example 121 | Material A-21 | Material B-1 | 2 | 1 |
| Example 122 | Material A-22 | Material B-1 | 2 | 3 |
| Example 123 | Material A-23 | Material B-1 | 2 | 1 |
| Example 124 | Material A-24 | Material B-1 | 2 | 1 |
| Example 125 | Material A-25 | Material B-1 | 2 | 1 |
| Example 126 | Material A-26 | Material B-1 | 2 | 1 |
| Example 127 | Material A-27 | Material B-1 | 2 | 1 |
| Example 128 | Material A-28 | Material B-1 | 2 | 1 |
| Example 129 | Material A-29 | Material B-1 | 3 | 2 |
| Example 130 | Material A-30 | Material B-1 | 3 | 1 |
| Example 131 | Material A-31 | Material B-1 | 3 | 1 |
| Example 132 | Material A-32 | Material B-1 | 3 | 1 |
| Example 133 | Material A-33 | Material B-1 | 3 | 1 |
| Example 134 | Material A-34 | Material B-1 | 3 | 1 |
| Example 135 | Material A-35 | Material B-1 | 3 | 1 |
| Example 136 | Material A-36 | Material B-1 | 2 | 1 |
| Example 137 | Material A-37 | Material B-1 | 1 | 1 |
| Example 138 | Material A-38 | Material B-1 | 1 | 1 |
| Example 139 | Material A-39 | Material B-1 | 1 | 2 |
| Example 140 | Material A-40 | Material B-1 | 1 | 3 |
| Example 141 | Material A-41 | Material B-1 | 2 | 2 |
| Example 142 | Material A-42 | Material B-1 | 1 | 1 |
| Example 143 | Material A-43 | Material B-1 | 1 | 1 |
| Example 144 | Material A-2 | Material B-2 | 1 | 1 |
| Comparative Example 101 | Material a-1 | Material B-1 | 4 | 1 |
| Comparative Example 102 | Material a-2 | Material B-1 | 2 | 4 |

As shown in Table 10, in Examples 101 to 143, Comparative Example 101, and Comparative Example 102 in which the transfer film having a laminated structure of the protective film/refractive index adjusting layer/photosensitive layer/temporary support was used, the same result as that in Examples 1 to 43, Comparative Example 1, and Comparative Example 2 was obtained.

The same result was obtained in Example 102 in which the material B-1 was used as the composition for forming the refractive index adjusting layer, and Example 144 in which the material B-2 was used as the composition for forming the refractive index adjusting layer.

From the above result, even in a case where the refractive index adjusting layer was present between the wiring for a touch panel and the photosensitive layer, it was confirmed that the discoloring of copper and the generation of development residue of the colored layer were prevented.

As the reason for the result described above, it is assumed that, since the refractive index adjusting layer is an extremely thin film, the specific azole compound included in the photosensitive layer is transferred to the refractive index adjusting layer, or the specific azole compound included in the dissolved photosensitive layer was in contact with copper, in a case where the unexposed portion of the photosensitive layer is removed by development.

The contents of JP2016-192277A filed on Sep. 29, 2016 are incorporated herein by reference.

All of the documents, the patent applications, and the technology standards described here are incorporated here by reference.

What is claimed is:

1. A manufacturing method of a touch panel, comprising:
   a step of preparing a substrate for a touch panel having a structure in which an electrode for a touch panel and a wiring for a touch panel are disposed on the substrate;
   a step of providing a photosensitive layer including a radical polymerizable monomer, a radical polymerization initiator, and at least one kind of azole compound selected from the group consisting of an imidazole compound, a triazole compound, a tetrazole compound, a thiazole compound, and a thiadiazole compound, on a surface of the substrate for a touch panel where the wiring for a touch panel is disposed;
   a step of performing pattern-exposing on the photosensitive layer;
   a step of developing the pattern-exposed photosensitive layer to form a protective layer including an opening for exposing a part of the wiring for a touch panel;
   a step of providing a colored layer which includes a colorant, a radical polymerizable monomer, and a radical polymerization initiator, and extends over the protective layer and the wiring for a touch panel exposed to the opening; and
   a step of performing pattern-exposing and development on the colored layer to form a colored pattern on the protective layer and expose the wiring for a touch panel to the opening.

2. The manufacturing method of a touch panel according to claim 1,
   wherein pKa of conjugate acid of the at least one kind of azole compound selected from the group consisting of an imidazole compound, a triazole compound, a tetrazole compound, a thiazole compound, and a thiadiazole compound is equal to or smaller than 4.00.

3. The manufacturing method of a touch panel according to claim 1,
   wherein the photosensitive layer includes at least one kind of azole compound selected from the group consisting of an imidazole compound, a triazole compound, and a tetrazole compound.

4. The manufacturing method of a touch panel according to claim 1,
   wherein the photosensitive layer includes at least one kind of azole compound selected from the group consisting of 1,2,4-triazole, 1,2,3-benzotriazole, and 5-amino-1H-tetrazole.

5. The manufacturing method of a touch panel according to claim 1,
   wherein the photosensitive layer includes an imidazole compound.

6. The manufacturing method of a touch panel according to claim 1,
   wherein the photosensitive layer includes a triazole compound.

7. The manufacturing method of a touch panel according to claim 1, wherein the photosensitive layer includes a tetrazole compound.

8. The manufacturing method of a touch panel according to claim 1,
wherein the photosensitive layer includes a thiazole compound.

9. The manufacturing method of a touch panel according to claim 1,
wherein the photosensitive layer includes a thiadiazole compound.

10. The manufacturing method of a touch panel according to claim 1,
wherein a content of the at least one kind of azole compound selected from the group consisting of an imidazole compound, a triazole compound, a tetrazole compound, a thiazole compound, and a thiadiazole compound in the photosensitive layer is 0.1% by mass to 10% by mass with respect to the amount of solid contents of the photosensitive layer.

11. The manufacturing method of a touch panel according to claim 1,
wherein a thickness of the photosensitive layer is 0.1 μm to 20 μm.

12. The manufacturing method of a touch panel according to claim 1,
wherein, in the step of forming the protective layer, the pattern-exposed photosensitive layer is developed with a developer including at least one kind of azole compound selected from the group consisting of an imidazole compound, a triazole compound, a tetrazole compound, a thiazole compound, and a thiadiazole compound.

* * * * *